United States Patent
Patel et al.

(10) Patent No.: US 11,569,555 B2
(45) Date of Patent: Jan. 31, 2023

(54) PHASE SHIFTER WITH ACTIVE SIGNAL PHASE GENERATION

(71) Applicant: Qualcomm Incorporated, San Diego, CA (US)

(72) Inventors: Chirag Dipak Patel, San Diego, CA (US); Xinmin Yu, San Diego, CA (US); Lai Kan Leung, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 432 days.

(21) Appl. No.: 16/785,440

(22) Filed: Feb. 7, 2020

(65) Prior Publication Data

US 2021/0175589 A1    Jun. 10, 2021

Related U.S. Application Data

(60) Provisional application No. 62/945,043, filed on Dec. 6, 2019.

(51) Int. Cl.

| H01P 1/18 | (2006.01) |
| H03H 11/22 | (2006.01) |
| H03H 11/20 | (2006.01) |
| H03F 3/60 | (2006.01) |
| H04B 7/06 | (2006.01) |

(52) U.S. Cl.
CPC ............... *H01P 1/18* (2013.01); *H03F 3/607* (2013.01); *H03H 11/20* (2013.01); *H03H 11/22* (2013.01); *H04B 7/0617* (2013.01)

(58) Field of Classification Search
CPC ............ H01P 1/18; H03F 3/607; H03F 3/605; H03H 11/20; H03H 11/22; H04B 7/0617

USPC ......................................................... 405/101
See application file for complete search history.

(56) References Cited

U.S. PATENT DOCUMENTS

| 4,977,382 A | 12/1990 | Podell et al. |
| 5,168,242 A | 12/1992 | Willems et al. |
| 5,168,250 A | 12/1992 | Bingham |

(Continued)

FOREIGN PATENT DOCUMENTS

| CN | 103986439 | 8/2014 |
| GB | 2529903 A | 3/2016 |

(Continued)

OTHER PUBLICATIONS

International Search Report and Written Opinion—PCT/US2020/059209—ISA/EPO—dated Feb. 24, 2021.

(Continued)

*Primary Examiner* — Harry K Liu
(74) *Attorney, Agent, or Firm* — Colby Nipper/Qualcomm

(57) ABSTRACT

An apparatus is disclosed for phase-shifting signals. In example implementations, the apparatus includes a phase shifter. The phase shifter includes a first port, a second port, a vector modulator coupled to the first port, and a signal phase generator. The signal phase generator includes multiple amplifiers coupled between the vector modulator and the second port. The signal phase generator also includes multiple capacitors that couple the multiple amplifiers together to form a loop. Each respective capacitor of the multiple capacitors is coupled between a respective pair of consecutive amplifiers of the multiple amplifiers to form the loop.

62 Claims, 20 Drawing Sheets

(56) References Cited

U.S. PATENT DOCUMENTS

| | | |
|---|---|---|
| 7,271,647 B2 | 9/2007 | Cao et al. |
| 8,203,394 B2 | 6/2012 | Kim et al. |
| 2016/0065179 A1 | 3/2016 | Taghivand et al. |

FOREIGN PATENT DOCUMENTS

| | | | | |
|---|---|---|---|---|
| JP | H0983297 A | 3/1997 | | |
| WO | 2007073150 A1 | 6/2007 | | |
| WO | WO-2014065825 A1 * | 5/2014 | ......... | H03H 11/0466 |
| WO | 2016034740 | 3/2016 | | |
| WO | 2017137891 | 8/2017 | | |

OTHER PUBLICATIONS

Kaltiokallio, et al., "Active Polyphase Filter Analysis", Proceedings of 2010 IEEE International Symposium on Circuits and System, 2010, pp. 1125-1128.

Kim, "W-band Phased Array Systems using Silicon Integrated Circuits", University of California, San Diego, Sang Young Kim, 2012, 2012, 120 pages.

Wang, et al., "A 6-bit 38GHz SiGe BiCMOS Phase Shifter for 5G Phased Array Communications", IEICE Electronics Express, vol. 14, No. 13, 1-10, 2017, 10 pages.

Yu, et al., "A 60 GHz Phase Shifter Integrated With LNA and PA in 65 nm CMOS for Phased Array Systems", IEEE Journal of Solid-State Circuits, vol. 45, No. 9, Sep. 2010, Sep. 2010, 13 pages.

Zhou, et al., "Digital Phase Shifter With High Phase Accuracy for Microwave Phased Array Application", IEEE MTT-S Undergraduate/Pre-Graduate Scholarship Project Report, 2 pages.

* cited by examiner

PHASE SHIFTER WITH ACTIVE SIGNAL PHASE GENERATION

CROSS-REFERENCE TO RELATED APPLICATION(S)

This application claims the benefit of U.S. Provisional Application No. 62/945,043, filed 6 Dec. 2019, the disclosure of which is hereby incorporated by reference in its entirety herein.

TECHNICAL FIELD

This disclosure relates generally to wireless communications with electronic devices and, more specifically, to implementing a phase shifter with active signal phase generation.

BACKGROUND

Electronic devices include traditional computing devices such as desktop computers, notebook computers, smartphones, wearable devices like a smartwatch, internet servers, and so forth. However, electronic devices also include other types of computing devices such as personal voice assistants, thermostats and other sensors or automated controllers, robotics, automotive electronics, devices embedded in other machines like refrigerators and industrial tools, Internet of Things (IoT) devices, and so forth. These various electronic devices provide services relating to productivity, communication, social interaction, security, safety, remote management, entertainment, transportation, and information dissemination. Thus, electronic devices play crucial roles in many aspects of modern society.

Many of the services provided by electronic devices in today's interconnected world depend at least partly on electronic communications. Electronic communications include, for example, those exchanged between or among different electronic devices using wireless or wired signals that are transmitted over one or more networks, such as the Internet, a Wi-Fi network, or a cellular network. Electronic communications therefore include both wireless and wired transmissions and receptions. To make such electronic communications, an electronic device uses a transceiver, such as a wireless transceiver.

Electronic communications can therefore be realized by propagating signals between two wireless transceivers at two different electronic devices. For example, using a wireless transmitter, a smartphone can transmit a wireless signal to a base station over an air medium as part of an uplink communication to support mobile services. Using a wireless receiver, the smartphone can receive a wireless signal from the base station via the air medium as part of a downlink communication to enable mobile services. With a smartphone, mobile services can include phone and video calls, social media interactions, messaging, watching movies, sharing videos, performing searches, acquiring map information or navigational instructions, finding friends, location-based services generally, transferring money, obtaining another service like a car ride, and so forth.

To provide these and other types of services, electronic devices typically use a wireless transceiver to communicate wireless signals in accordance with some wireless standard. Examples of wireless standards include an IEEE 802.11b or 802.11g Wi-Fi standard and a Fourth Generation (4G) cellular standard, both of which are used today with smartphones and other connected devices. However, efforts to enable faster wireless networks through the creation of newer wireless standards are ongoing. Next-generation cellular networks and newer Wi-Fi networks, for example, are expected to offer significantly higher bandwidths, lower latencies, and access to additional electromagnetic spectrum. Taken together, this means that exciting new wireless services can be provided to users, such as self-driving vehicles, augmented reality (AR) and other mixed reality (MR) imaging, on-the-go 4K video streaming, ubiquitous sensors to keep people safe and to use natural resources more efficiently, real-time language translations, and so forth.

To make these new, faster wireless technologies more widely available, many wireless devices besides smartphones will be deployed, which is sometimes called the "Internet of Things" (IoT). Compared to today's use of wireless devices, tens of billions, and eventually trillions, of more devices are expected to be connected to the internet with the arrival of the Internet of Things. These IoT devices may include small, inexpensive, and low-powered devices, like sensors and tracking tags. Further, to enable next-generation wireless technologies, Fifth Generation (5G) cellular wireless devices and Wi-Fi 6 devices will be communicating with signals that use wider frequency ranges that are located at higher frequencies of the electromagnetic spectrum as compared to those devices that operate in accordance with older wireless standards. For example, newer devices will be expected to operate at millimeter wave (mmW) frequencies (e.g., frequencies between at least 30 and 300 Gigahertz (GHz), but also including frequencies as low as 4-6 GHz).

To accommodate these commercial expectations and surmount the associated technical hurdles, the physical components that enable wireless communications under these constraints will be expected to operate efficiently at mmW frequencies. One component that facilitates electronic communication is the wireless interface device, which can include a wireless transceiver and a radio-frequency front-end (RFFE). Unfortunately, the wireless interface devices designed for electronic devices that operate in accordance with the Wi-Fi and 4G cellular standards of today are not adequate for the faster Wi-Fi 6 and 5G-capable devices of tomorrow, which devices will confront higher frequencies, more-stringent latency demands, and tighter fiscal constraints.

Consequently, to facilitate the adoption of newer cellular and faster Wi-Fi technologies, as well as the widespread deployment of electronic devices that can provide new capabilities and services, wireless interface devices will be deployed having designs that can handle mmW frequencies. Electrical engineers and other designers of electronic devices are therefore striving to develop new wireless interface devices that will enable the promise of 5G, Wi-Fi 6, and other higher-frequency technologies to become a reality.

SUMMARY

The developing wireless standards for cellular 5G and Wi-Fi 6 networks, for instance, are intended to establish broadband capabilities at higher frequencies in the gigahertz (GHz) range, including those frequencies with corresponding millimeter wavelengths (e.g., mmW frequencies). To enable wireless communications with mmW frequencies, some electronic devices use signal beamforming. Beamforming entails employing an antenna array to direct a signal beam. Aiming a signal beam from an origin apparatus toward a destination apparatus can decrease an amount of transmit power required to reach the destination apparatus. Further, beamforming enables a signal to be propagated over a greater distance as compared to an omnidirectional transmission, including with transmissions at mmW frequencies. To generate a signal beam, multiple antenna elements of an antenna array transmit or receive different versions of a wireless signal, such as different delayed or phase-shifted versions of a wireless signal. In some architectures, a component chain is associated with each antenna element of the antenna array to generate a respective wireless signal version. Individual physical components of each component chain are therefore reproduced for each antenna element, and a single electronic device can include many antenna elements, such as 4, 12, 16, 18, or more across multiple antenna arrays. Consequently, a negative effect resulting from any particular physical component that is part of a component chain, such as a size occupied by an individual physical component, is multiplied by a quantity of antenna elements included in the electronic device.

An example of an individual physical component that may be included in each component chain is a phase shifter. A phase shifter can adjust a phase of a version of a wireless signal relative to other versions of the wireless signal to enable beamforming for mmW and other frequencies of wireless communications. A phase shifter can be constructed using, for example, a signal phase generator and a vector modulator. In some implementations, the signal phase generator converts a signal having one phase to a split signal having at least two phases for at least two components of the signal. In some scenarios, two phases of a split signal are separated by ninety degrees (90°), such as by having 0° and 90° phases. Such a split signal can be referred to as having an in-phase signal component and a quadrature signal component. The vector modulator of the phase shifter adjusts relative amplitudes of the components of the split signal. After recombining the components of the split signal, the relative amplitude adjustment can effectively change a phase of a signal flowing through a given component chain to support beamsteering operations.

A signal phase generator of a phase shifter can be implemented using active or passive components. Passive components include capacitors, resistors, and inductors. Inductors occupy a significant area of a radio-frequency (RF) integrated circuit (IC) (RFIC). Resistors introduce an appreciable level of loss to a signal propagating through a signal phase generator. Generally, smaller RF ICs can enable less expensive devices, and lower-loss circuitry can provide higher signal processing performance. Accordingly, performance can be improved by avoiding usage of inductors and resistors.

More specifically, by reducing the usage of inductors and resistors in a signal phase generator, an area occupied by a phase shifter that includes the signal phase generator and an amount of loss caused by the phase shifter can both be reduced. To do so, described phase shifter implementations utilize an active signal phase generator. An active signal phase generator can include, for example, transistors and capacitors in which a direct-current (DC) current flows through at least a portion of the transistors. In some implementations, transistors are deployed as amplifiers in multiple columnar circuits that align with a signal flow direction, and capacitors couple transistors in consecutive columnar circuits together to form a loop that is orthogonal to the signal flow direction. During propagation of at least one alternating-current (AC) signal through the amplifiers of the columnar circuits, the capacitors of the capacitively-coupled loop can distribute phase differences of the AC signal across the amplifiers of the columnar circuits. For instance, if a signal having two phases of 0° and 180° (e.g., one differential signal) is applied to one side of a signal phase generator, the signal phase generator can produce a signal having four relative phases of 0°, 90°, 180°, and 270° (e.g., two differential signals) at another side of the signal phase generator. Both bidirectional and unidirectional implementations of active signal phase generators are described herein.

To produce a phase shifter, an active or a passive vector modulator can be implemented with an active signal phase generator. The phase shifter can be configured so that the vector modulator operates before or after the signal phase generator along a signal flow direction. In other words, the vector modulator can adjust at least one amplitude of one or more signal components either before or after the signal phase generator generates at least one additional signal phase component. Further, some described phase shifters can be operated bidirectionally, which enables one phase shifter to be used for both transmit and receive operations. In these manners, a fully or partially active phase shifter can be realized that is smaller than those implemented with an inductive-capacitive network and that introduces less loss than those implemented with a resistive-capacitive network.

In an example aspect, an apparatus for phase-shifting signals with active signal phase generation is disclosed. The apparatus includes a phase shifter. The phase shifter includes a first port, a second port, a vector modulator coupled to the first port, and a signal phase generator. The signal phase generator includes multiple amplifiers coupled between the vector modulator and the second port. The signal phase generator also includes multiple capacitors that couple the multiple amplifiers together to form a loop. Each respective capacitor of the multiple capacitors is coupled between a respective pair of consecutive amplifiers of the multiple amplifiers to form the loop.

In an example aspect, an apparatus for phase-shifting signals with active signal phase generation is disclosed. The apparatus includes a phase shifter. The phase shifter includes a first port, a second port, a vector modulator coupled to the first port, and a signal phase generator. The signal phase generator includes amplification means for amplifying a signal being phase shifted, with the amplification means including multiple input terminals and multiple output terminals and coupled between the vector modulator and the second port. The signal phase generator also includes capacitive means for distributing multiple phases of the signal across the amplification means, with the capacitive means coupling the multiple input terminals to the multiple output terminals.

In an example aspect, a method for phase shifting with active signal phase generation is disclosed. The method includes coupling a signal having a first quantity of phases via a second port. The method also includes amplifying multiple components of the signal using multiple amplifiers. The method additionally includes distributing multiple phases of the multiple components of the signal across the multiple amplifiers using a capacitively-coupled loop, with the multiple phases having a second quantity of phases that is greater than the first quantity. The method also includes adjusting one or more amplitudes of the multiple components of the signal based on a phase control signal. The method further includes combining the multiple phases of the multiple components of the signal to produce a combined signal having the first quantity of phases. The method additionally includes coupling the combined signal having the first quantity of phases via a first port.

In an example aspect, an apparatus for phase-shifting signals with active signal phase generation is disclosed. The apparatus includes a phase shifter. The phase shifter includes a first port including two or more nodes, a second port including two or more nodes, and an interface including four or more nodes. The phase shifter also includes a vector modulator coupled between the first port and the interface. The phase shifter further includes a signal phase generator. The signal phase generator includes four or more columnar circuits coupled between the interface and the second port, with each columnar circuit including a first transistor and a second transistor. The first transistor and the second transistor of each respective columnar circuit are coupled together in series between a node of the interface and a node of the second port. The signal phase generator also includes a first set of four or more capacitors that couple the four or more columnar circuits together to form a first loop, with each respective capacitor coupled between a respective pair of first transistors from two consecutive columnar circuits of the four or more columnar circuits to form the first loop. The signal phase generator further includes a second set of four or more capacitors that couple the four or more columnar circuits together to form a second loop, with each respective capacitor coupled between a respective pair of second transistors from two consecutive columnar circuits of the four or more columnar circuits to form the second loop.

BRIEF DESCRIPTION OF DRAWINGS

FIG. 3-1 illustrates an antenna array coupled to an example RF front-end that includes multiple component chains, each of which includes a phase shifter.

FIG. 3-2 illustrates an antenna element coupled to a portion of a component chain, which includes a phase shifter that can be operated bidirectionally.

FIG. 3-3 illustrates an antenna element coupled to a portion of a component chain, which includes two phase shifters that can each be operated unidirectionally.

FIG. 4-1 illustrates an example phase shifter including a signal phase generator, a vector modulator, an interface therebetween, and multiple ports.

FIG. 4-2 illustrates an example phase shifter including a signal phase generator and a vector modulator and depicts multiple phases of multiple components of a signal using phasors.

FIG. 4-3 illustrates an example phase shifter including a signal phase generator and a vector modulator and depicts multiple example signal flow directions across different implementations of the phase shifter.

FIG. 5-1 illustrates a schematic diagram of an example signal phase generator including multiple capacitors and multiple amplifiers having at least one amplification stage per amplifier.

FIG. 5-2 illustrates a schematic diagram of an example signal phase generator including multiple capacitors and multiple amplifiers having at least two amplification stages per amplifier.

FIG. 13-1 illustrates an example phase shifter including a signal phase generator and an active vector modulator that is implemented using banks of transistors configured as variable gain amplifiers (VGAs).

FIG. 13-2 illustrates an example bidirectional VGA that can be used in the active vector modulator of FIG. 13-1.

DETAILED DESCRIPTION

Figure 1:
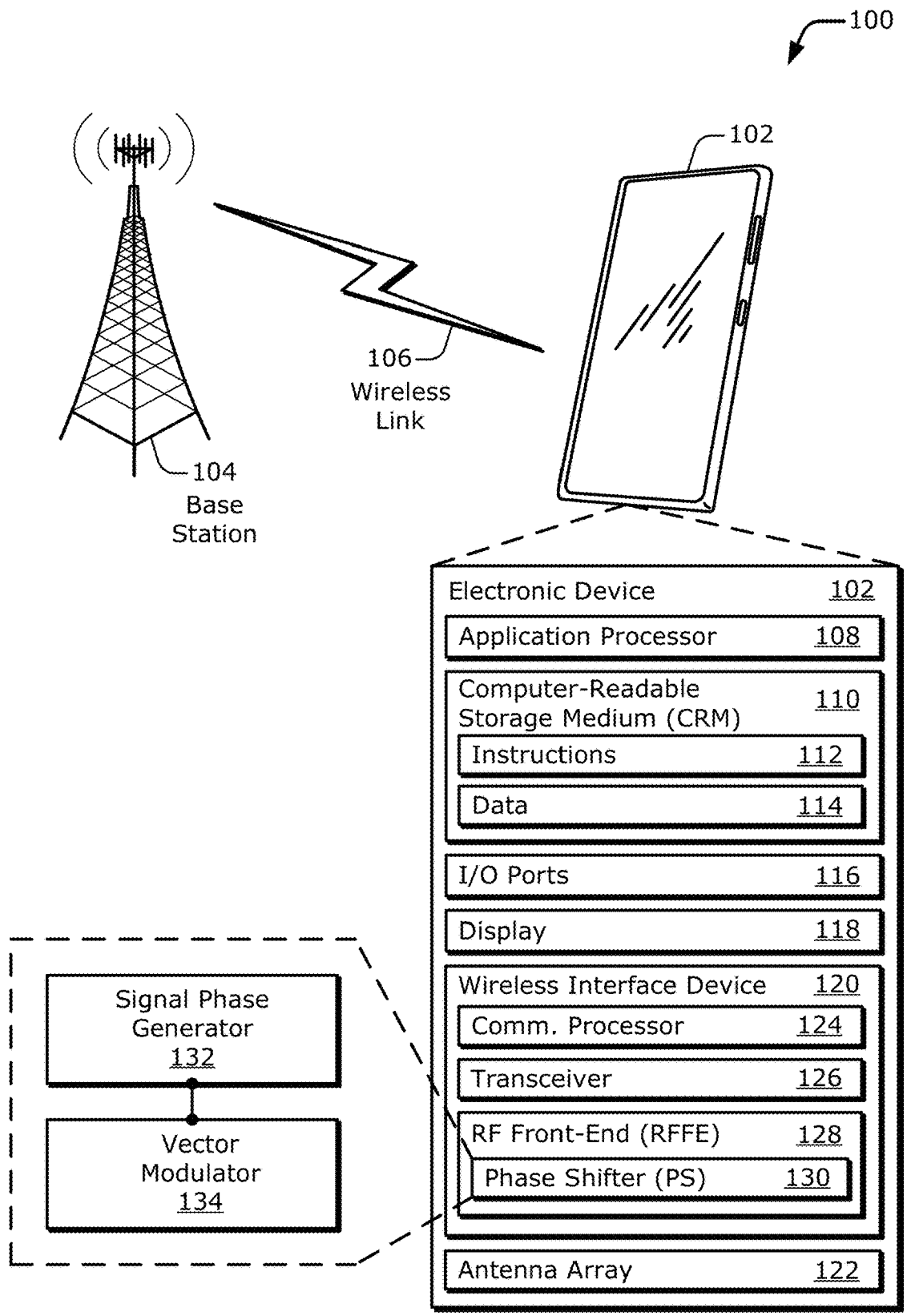
FIG. 1 illustrates an example environment that includes an electronic device having a wireless interface device with a radio-frequency (RF) front-end (FE) (RFFE), which includes a phase shifter.

As compared to 4G cellular and existing Wi-Fi networks, next-generation networks, such as 5G cellular and Wi-Fi 6 networks, will utilize higher electromagnetic (EM) frequencies. These higher EM frequencies include millimeter wave (mmW) frequencies that can span approximately 3 to 300 Gigahertz (GHz) of the EM spectrum. Although higher frequencies can offer higher bandwidth and lower latency, higher frequencies also cause technical difficulties. For example, signals transmitted at higher frequencies are attenuated by the atmosphere more quickly and therefore have shorter intrinsic ranges at a given power level. To account for the naturally-shorter propagation distances, signals can be transmitted in signal beams that direct a signal toward a particular target with more effective power, which is called antenna beamforming. Using antenna beamforming, a transmission at a given power level can travel farther as a signal beam as compared to a signal being transmitted omnidirectionally.

Thus, 5G cellular and Wi-Fi 6 (e.g., IEEE 802.11ax) electronic devices may utilize beamforming to direct signals toward receiving devices. A wireless interface device of an electronic device is at least partially responsible for generating signal beams for beamforming. To form a transmission signal beam, a wireless interface device uses an antenna array to emanate multiple versions of a transmission signal in which the versions are modified with respect to each other to cause the signals versions to constructively and destructively combine during signal propagation. The modifications of the different signal versions can include being amplified by different amounts or being phase shifted with respect to each other (e.g., delayed relative to one another by different time durations). Areas of constructive EM combination produce a signal beam that can be received at relatively farther distances as compared to without using antenna beamforming Receiving a communication signal with beamforming techniques works in a reverse manner by processing the different versions to reconstruct a received signal beam.

Generally, each signal version is provided to or accepted from a respective antenna element of an antenna array. To modify different signal versions corresponding to respective ones of different antenna elements of an antenna array, a wireless interface device that is coupled to the antenna array may include a respective component chain of multiple component chains for each respective antenna element of multiple antenna elements. Further, an electronic device may include multiple antenna arrays that each have multiple antenna elements to aim signal beams from different sides of the electronic device. In some architectures, there is a component chain associated with and coupled to each antenna element of an antenna array. Individual physical components of each component chain are thus reproduced for each antenna element, which can have a quantity of 6, 8, 12, 16, or more in a single electronic device. If, for instance, an electronic device includes three antenna arrays each having four antenna elements, the electronic device may include a dozen total antenna elements and therefore a dozen corresponding component chains. Consequently, an impact resulting from each individual physical component, such as a negative effect caused by any individual physical component, of a component chain is multiplied by a quantity of antenna elements included in the electronic device. Examples of negative effects include a size occupied by an individual physical component, a power usage of the component, or a loss of signal strength imparted to a signal being processed by the component.

An example of an individual physical component that may be included in each component chain is a phase shifter. A phase shifter can adjust a phase of a version of a wireless signal relative to other versions of the wireless signal to enable beamforming for mmW and other frequencies of wireless communications. A phase shifter can be constructed using, for example, a signal phase generator and a vector modulator. In some implementations, a signal phase generator converts a signal having one phase to a split signal having at least two phases for at least two components of the signal. In some scenarios, two phases of a split signal are separated by ninety degrees (90°), such as by having 0° and 90° phases. This type of split signal that includes two components having different phases that are separated by 90° can be referred to as having an in-phase signal component and a quadrature signal component. The vector modulator of the phase shifter adjusts relative amplitudes of the components of the split signal. After recombining the components of the split signal, the relative amplitude adjustment can effectively change a phase of a version of a wireless signal flowing through the corresponding component chain to realize phase shifting in support of antenna beamforming.

Phase shifters can be implemented fully or partially in a passive or active manner Passive phase shifters can be used to achieve about three bits of resolution, with the number of bits of resolution determining a granularity of the phase shift amounts. The quantity of bits in passive phase shifters is limited due to the large size of, and appreciable attenuation caused by, passive components (e.g., resistors, capacitors, and/or inductors) and switches that form a passive phase shifter. Active phase shifters, on the other hand, can enable a higher bit resolution for a finer phase-shift granularity. Instead of being limited to 45° phase-shift increments with a three-bit phase shifter, 22.5° and 11.25° phase-shift increments can be achieved with four- and five-bit phase shifters, respectively. This enables a signal beam to be more finely aimed with, e.g., a five-bit active phase shifter. Active phase shifters typically use an active vector modulator for amplitude adjustment of the split signals. However, active phase shifters typically employ a passive circuit structure to generate the in-phase and quadrature (IQ) signal components that are adjusted by the vector modulator for the phase shifting. Passive approaches to IQ-signal generation usually result in approximately 3 decibels (dB) or more of loss. Passive IQ-signal generation with inductors (L) and capacitors (C) is lossy and can result in large LC circuits. In contrast, passive IQ-signal generation with resistors (R) and capacitors (C) can use smaller circuits, but this RC-circuit approach is even more lossy than the LC-circuit approach.

In short, higher-resolution phase shifters tend to passively generate IQ signal components but actively perform the vector modulation. Although there are numerous ways to passively generate IQ signals, each way usually causes a loss of approximately 3 dB or greater and uses components that consume a significant portion of an area of an RF IC. Techniques to compensate for this loss of signal strength, which arises from passively generating IQ signals, include ancillary signal amplification that both involves additional circuitry and introduces further complications into using phased-array antennas for beamforming.

In contrast with a phase shifter that uses a passive IQ-signal generator, some described implementations are directed to a phase shifter that employs an active signal phase generator. An example phase shifter includes an active signal phase generator and a vector modulator, which may be passive or active. Thus, applicable vector modulators can include those formed with resistors and those formed with transistors. Some described signal phase generators can be implemented bidirectionally. Consequently, some phase shifter implementations can operate bidirectionally, including fully-active implementations with both an active signal phase generator and an active vector modulator. Depending on phase shifter implementation, an order of operation of a vector modulator relative to that of an active signal phase generator can vary with respect to a signal flow direction through the phase shifter. For instance, the vector modulator may operate on a signal propagating through the phase shifter before or after when the signal phase generator operates on the signal. In other words, the vector modulator can adjust at least one amplitude of one or more signal components either before or after the signal phase generator generates at least one additional signal phase component of the signal propagating through the phase shifter.

In example implementations, an active signal phase generator of a phase shifter includes multiple amplifiers that are capacitively coupled together such that the capacitor couplings form at least one loop. The multiple amplifiers are powered and have a direct-current (DC) current that flows through them during operation. At least one capacitor is coupled between consecutive amplifiers along the loop that is defined by the capacitor couplings. Each of the amplifiers includes at least one amplification stage. A two-stage amplifier, for instance, includes a first amplification stage and a second amplification stage, with each respective stage being coupled together in a respective loop with a respective set of capacitors. The capacitors can be cross-coupled between consecutive amplification stages such that one terminal of a capacitor is coupled to an input of a first instance of an amplification stage at a first amplifier and another terminal of the capacitor is coupled to an output of a second instance of the amplification stage at a second amplifier, which is consecutively coupled to the first amplifier by a capacitive loop.

By capacitively coupling the amplifiers together, the capacitors distribute different phases of a signal around the loop of capacitors and thus across each amplification stage. In this manner, an active signal phase generator can increase a quantity of phases of different components of a signal that is traversing the active signal phase generator. A first quantity of phases that are present at first side of the signal phase generator is increased relative to a second quantity of phases that are present at a second side of the signal phase generator, and vice versa. For instance, if a signal having two phases of 0° and 180° (e.g., a differential I signal) is applied to one side of a signal phase generator, the signal phase generator can cause the signal to have four relative phases of 0°, 90°, 180°, and 270° (e.g., differential I and Q signal components) at another side of the signal phase generator.

By reducing usage of inductors and resistors in a signal phase generator, an area occupied by a phase shifter that includes the signal phase generator and an amount of loss caused by the phase shifter can both be reduced. As described herein, implementations of an active signal phase generator can include transistors and capacitors in which a direct-current (DC) current flows through at least a portion of the transistors during operation. In some implementations, these transistors are deployed as amplifiers in multiple columnar circuits that align with a direction of signal flow through the phase shifter, and the capacitors couple transistors in consecutive columnar circuits together to form a loop of capacitors in a row that is orthogonal to the signal flow direction. An active or passive vector modulator can be paired with the active signal phase generator to construct a phase shifter. The vector modulator can include multiple portions with each respective portion coupled to a respective columnar circuit of multiple columnar circuits to adjust, for a respective amplifier corresponding thereto, at least one amplitude of a respective component having a phase of a signal propagating through the phase shifter.

A passive vector modulator can be built using resistors that are arranged as respective voltage dividers for respective portions of the vector modulator to adjust an amplitude of respective phase components of a signal. An active vector modulator can be built using a bank of transistors (e.g., multiple transistors coupled together in parallel for current steering or multiple transistors realizing a variable gain amplifier (VGA)) for each portion of the vector modulator to adjust an amplitude of each respective phase component of a signal. In these manners, a partially or fully active phase shifter can be realized that is smaller than those implemented with an inductor-capacitor network and that introduces less loss than those implemented with a resistor-capacitor network.

FIG. 1 illustrates an example environment 100 that includes an electronic device 102 having a wireless interface device 120 with a radio-frequency (RF) front-end (FE) 128 (RFFE), which includes a phase shifter 130. The phase shifter 130 includes a signal phase generator 132 and a vector modulator 134. In the environment 100, the example electronic device 102 communicates with a base station 104 through a wireless link 106. In FIG. 1, the electronic device 102 is depicted as a smartphone. However, the electronic device 102 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, fitness management device, wearable device such as intelligent glasses or smart watch, wireless power device (transmitter or receiver), medical device, and so forth.

The base station 104 communicates with the electronic device 102 via the wireless link 106, which may be implemented as any suitable type of wireless link that carries a communication signal. Although depicted as a base station tower of a cellular radio network, the base station 104 may represent or be implemented as another device, such as a satellite, terrestrial broadcast tower, access point, peer-to-peer device, mesh network node, fiber optic line, another electronic device as described above generally, and so forth. Hence, the electronic device 102 may communicate with the base station 104 or another device via a wired connection, a wireless connection, or a combination thereof.

The wireless link 106 extends between the electronic device 102 and the base station 104. The wireless link 106 can include a downlink of data or control information communicated from the base station 104 to the electronic device 102 and an uplink of other data or control information communicated from the electronic device 102 to the base station 104. The wireless link 106 may be implemented using any suitable communication protocol or standard. Examples of such protocols and standards include a 3rd Generation Partnership Project (3GPP) standard, such as a Long-Term Evolution (LTE), a Fourth Generation (4G), or a Fifth Generation (5G) cellular standard; an IEEE 802.11 standard, such as 802.11g, ac, ax, ad, aj, or ay standard, including Wi-Fi 6; an IEEE 802.16 standard (e.g., WiMAX™); a Bluetooth™ standard; and so forth. In some implementations, the wireless link 106 may wirelessly provide power, and the electronic device 102 or the base station 104 may comprise a power source.

As shown, the electronic device 102 includes at least one application processor 108 and at least one computer-readable storage medium 110 (CRM 110). The application processor 108 may include any type of processor, such as a central processing unit (CPU) or a multi-core processor, that is configured to execute processor-executable instructions (e.g., code) stored by the CRM 110. The CRM 110 may include any suitable type of data storage media, such as volatile memory (e.g., random-access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the electronic device 102, and thus the CRM 110 does not include transitory propagating signals or carrier waves.

The electronic device 102 may also include one or more input/output ports 116 (I/O ports 116) or at least one display 118. The I/O ports 116 enable data exchanges or interaction with other devices, networks, or users. The I/O ports 116 may include serial ports (e.g., universal serial bus (USB) ports), parallel ports, audio ports, infrared (IR) ports, camera or other sensor ports, and so forth. The display 118 can be realized as a display screen or a projection that presents one or more graphical images provided by the electronic device 102, such as a user interface associated with an operating system, program, or application. Alternatively or additionally, the display 118 may be implemented as a display port or virtual interface through which graphical content of the electronic device 102 is communicated or presented.

The electronic device 102 further includes at least one wireless interface device 120 and at least one antenna array 122. The wireless interface device 120 provides connectivity to respective networks and peer devices via a wireless link, which may be configured similar to or differently from the wireless link 106. Alternatively or additionally, the electronic device 102 may include a wired interface device, such as an Ethernet or fiber optic transceiver for communicating over a wired local area network (LAN), an intranet, or the Internet. The wireless interface device 120 may facilitate communication over any suitable type of wireless network, such as a wireless LAN (WLAN), wireless personal-area-network (PAN) (WPAN), peer-to-peer (P2P) network, mesh network, cellular network, wireless wide-area-network (WAN) (WWAN), and/or a navigational network (e.g., the Global Positioning System (GPS) of North America or another Satellite Positioning System (SPS) or Global Navigation Satellite System (GNSS)). In the context of the example environment 100, the electronic device 102 can communicate various data and control information bidirectionally with the base station 104 via the wireless interface device 120. However, the electronic device 102 may also or instead communicate directly with other peer devices, an alternative wireless network, and the like.

As shown, the wireless interface device 120 includes at least one communication processor 124, at least one transceiver 126, and at least one RF front-end 128 (RFFE 128). These components process data information, control information, and signals associated with communicating information for the electronic device 102 via the antenna array 122. The communication processor 124 may be implemented as at least part of a system-on-chip (SoC), a modem baseband processor, or a baseband radio processor (BBP) that enables a digital communication interface for data, voice, messaging, or other applications of the electronic device 102. The communication processor 124 includes a digital signal processor (DSP) or one or more signal-processing blocks (not shown) for encoding and modulating data for transmission and for demodulating and decoding received data. Additionally, the communication processor 124 may also manage (e.g., control or configure) aspects or operation of the transceiver 126, the RF front-end 128, and other components of the wireless interface device 120 to implement various communication protocols or communication techniques.

In some cases, the application processor 108 and the communication processor 124 can be combined into one module or integrated circuit (IC), such as an SoC. Regardless, the application processor 108 or the communication processor 124 can be operatively coupled to one or more other components, such as the CRM 110 or the display 118, to enable control of, or other interaction with, the other components of the electronic device 102. Thus, an operative coupling can enable components to perform a function or operate as described herein. The communication processor 124 may also include a memory (not separately shown), such as a CRM 110, to store data and processor-executable instructions (e.g., code). The various components illustrated in FIG. 1 using separate schematic blocks may be manufactured or packaged in different discrete manners. For example, one physical module may include components of the RF front-end 128 and some components of the transceiver 126, and another physical module may combine the communication processor 124 with the remaining components of the transceiver 126. Additionally, at least one antenna array 122 may be co-packaged with at least some components of an RF front-end 128 as an "antenna module." Further, an electronic device 102 may include multiple such antenna modules, thereby spatially distributing various physical components of at least one RF front-end 128 within a housing of the electronic device 102.

The transceiver 126 can include circuitry and logic for filtering, amplification, channelization, and frequency translation. The frequency translation may include an up-conversion or a down-conversion of frequency that is performed in a single conversion operation (e.g., a direct-conversion architecture) or through multiple conversion operations (e.g., a superheterodyne architecture). The transceiver 126 can include filters, switches, amplifiers, mixers, and so forth for routing and conditioning signals that are transmitted or received via the antenna array 122. Although not explicitly shown, the wireless interface device 120 can also include a digital-to-analog converter (DAC) or an analog-to-digital converter (ADC) to convert between analog signals and digital signals. A DAC or an ADC can be implemented as part of the communication processor 124, as part of the transceiver 126, or separately from both of them.

The components or circuitry of the transceiver 126 can be implemented in any suitable fashion, such as combined transceiver logic or separately as respective transmitter and receiver entities. In some cases, the transceiver 126 is implemented with multiple or different sections to implement respective transmitting and receiving operations (e.g., separate transmit and receive chains, respectively). The transceiver 126 may also include logic to perform in-phase/quadrature (I/Q) operations, such as synthesis, phase correction, modulation, demodulation, and the like.

Generally, the RF front-end 128 includes one or more filters, switches, or amplifiers for conditioning signals received via the antenna array 122 or signals to be transmitted via the antenna array 122. As shown, the RF front-end 128 includes at least one phase shifter 130 (PS 130). The RF front-end 128 may also include other RF sensors and components, such as a peak detector, power meter, gain control block, antenna tuning circuit, N-plexer, balun, and the like. Configurable components of the RF front-end 128, such as the phase shifter 130, may be controlled by the communication processor 124 to implement communications in various modes, with different frequency bands, or using antenna beamforming Although the phase shifter 130 is depicted as being part of an RF front-end 128, described implementations of a phase shifter 130 can alternatively be employed in other portions of the wireless interface device 120 (e.g., the transceiver 126) or in other portions of the electronic device 102 generally.

In example implementations, the phase shifter 130 includes at least one signal phase generator 132 and at least one vector modulator 134. The signal phase generator 132 changes a quantity of phases of a signal, such as by generating at least one phase to increase a quantity of phases. For instance, a signal phase generator 132 can produce I and Q signal components (e.g., with two phases for single-ended signaling) from an I signal component (e.g., with one phase for single-ended signaling). The vector modulator 134 adjusts at least one amplitude of one or more components of a signal traversing circuitry of the vector modulator 134. The adjustment can include increasing signal amplitude (e.g., positive amplification, amplification by a gain that is greater than one, or an amplification) or decreasing signal amplitude (e.g., negative amplification, amplification by a gain between zero and one, or an attenuation). Example implementations of the signal phase generator 132 and the vector modulator 134 are described herein below, starting with FIGS. 4-1 to 4-3.

In some implementations, the antenna array 122 is implemented as at least one antenna array that include multiple antenna elements. Thus, as used herein, an "antenna" can refer to at least one antenna array or at least one antenna element, depending on context. To implement beamforming, a respective phase shifter 130 is coupled to each respective antenna element of the antenna array 122, which is described below with reference to FIGS. 3-1 to 3-3. Additional aspects of the wireless interface device 120 and the antenna array 122 in terms of antenna beamforming are described next with reference to FIG. 2.

Figure 2:
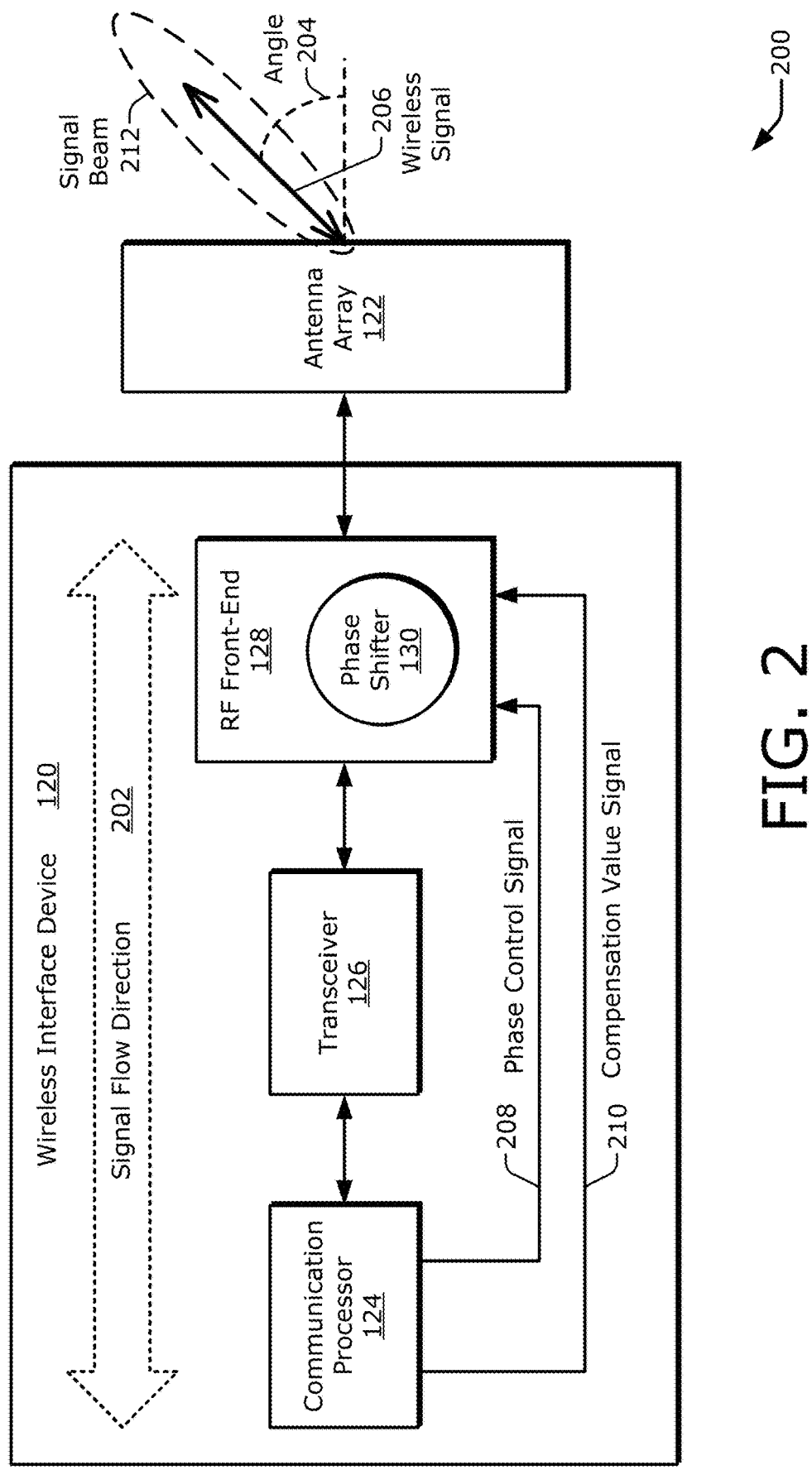
FIG. 2 illustrates an antenna array coupled to an example wireless interface device that includes a communication processor and an RF front-end with at least one phase shifter.

FIG. 2 illustrates at 200 generally the antenna array 122 coupled to an example implementation of the wireless interface device 120, which includes the communication processor 124 and the RF front-end 128. An example signal flow direction 202 is depicted bidirectionally. Thus, signals can flow in both directions across the wireless interface device 120 to accommodate both transmission and reception signals. As shown, the communication processor 124 is coupled to the transceiver 126, and the transceiver 126 is coupled to the RF front-end 128, which includes at least one phase shifter 130. Although not explicitly shown, the communication processor 124 can be coupled to other components of the electronic device 102 of FIG. 1, such as the application processor 108, the CRM 110, or the display 118.

In operation, the antenna array 122 emanates for transmission or senses for reception at least one wireless signal 206. With antenna beamforming, the wireless signal 206 can be transmitted or received via at least one signal beam 212. Using beamsteering, the wireless signal 206 can therefore be transmitted or received relative to at least one angle 204 to provide for wireless communication directionality. To do so, the phase shifter 130 of the RF front-end 128 shifts a phase of a version of a signal propagating through the phase shifter 130, with the propagating signal previously received as the wireless signal 206 or targeted to be transmitted as the wireless signal 206.

An amount of a phase shift by the phase shifter 130 can be controlled by the communication processor 124 using at least one phase control signal 208. The communication processor 124 can generate the phase control signal 208 responsive to beamforming parameters indicative of a targeted angle 204 or a targeted number of degrees of a phase shift. This control of the phase shifting is described further herein below. The communication processor 124 can also generate a compensation value signal 210 and provide the compensation value signal 210 to another component, such as the phase shifter 130. The compensation value signal 210 can adjust the processing of a signal being phase shifted to account for non-linearity or for different amplification levels corresponding to different phase-shift amounts. Implementation of a compensation value signal 210 is described herein below. Alternatively, the transceiver 126 can generate or provide the phase control signal 208 or the compensation value signal 210. More generally, a controller (not shown) that is part of at least one of the communication processor 124 or the transceiver 126 can generate or provide the phase control signal 208 or the compensation value signal 210.

Figures 1, 3:
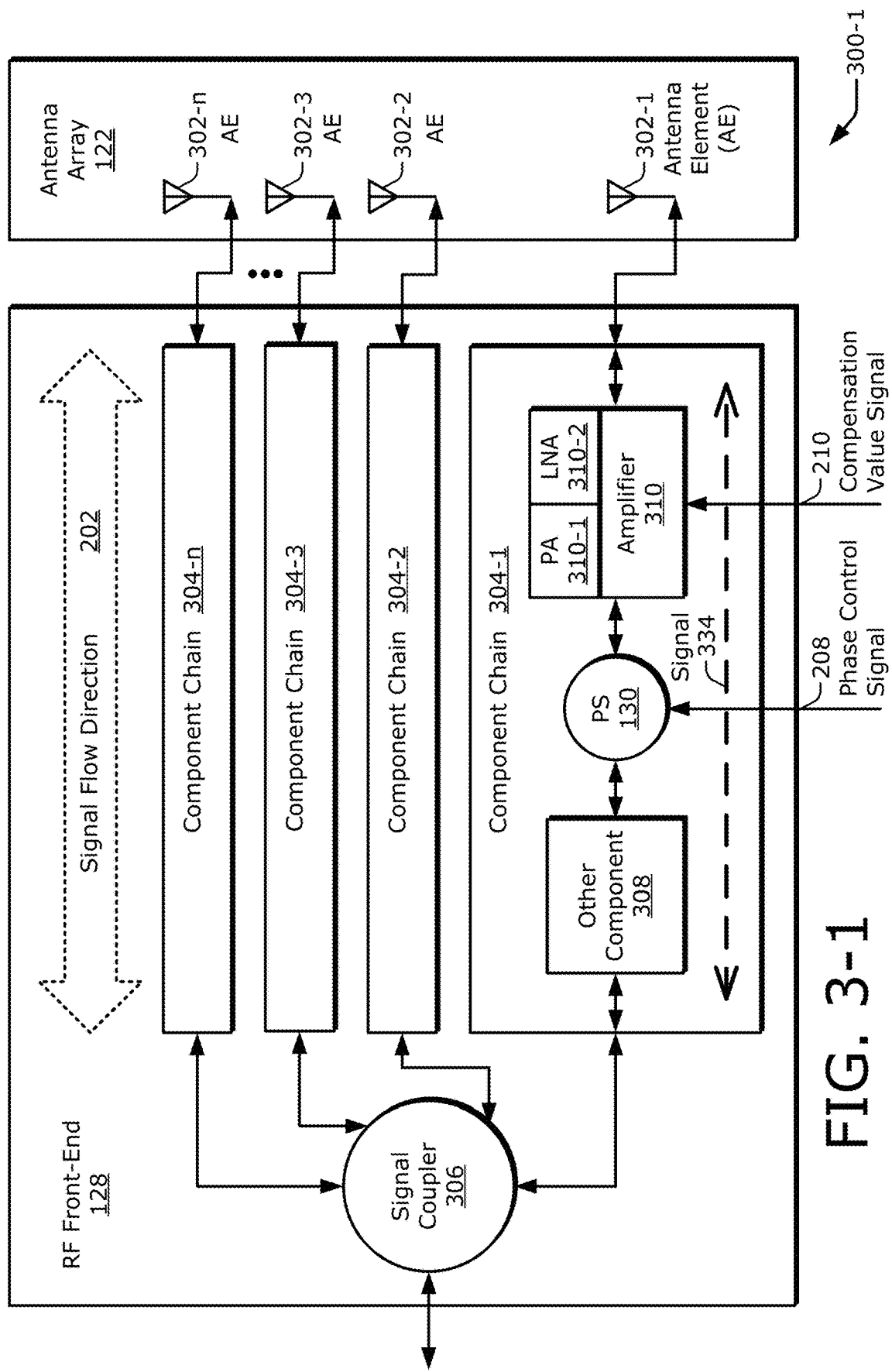
Figures 2, 3:
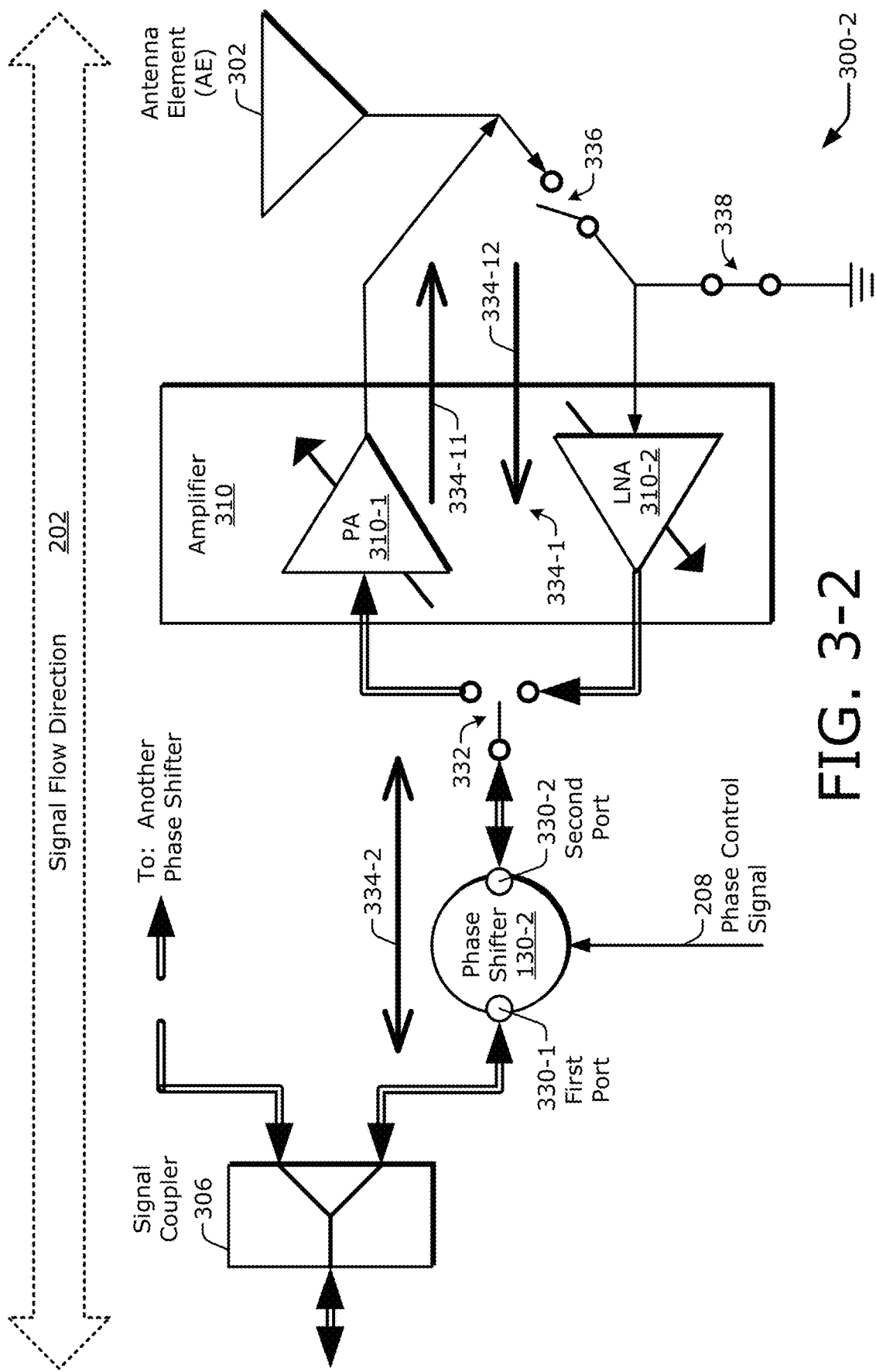
Figure 3:
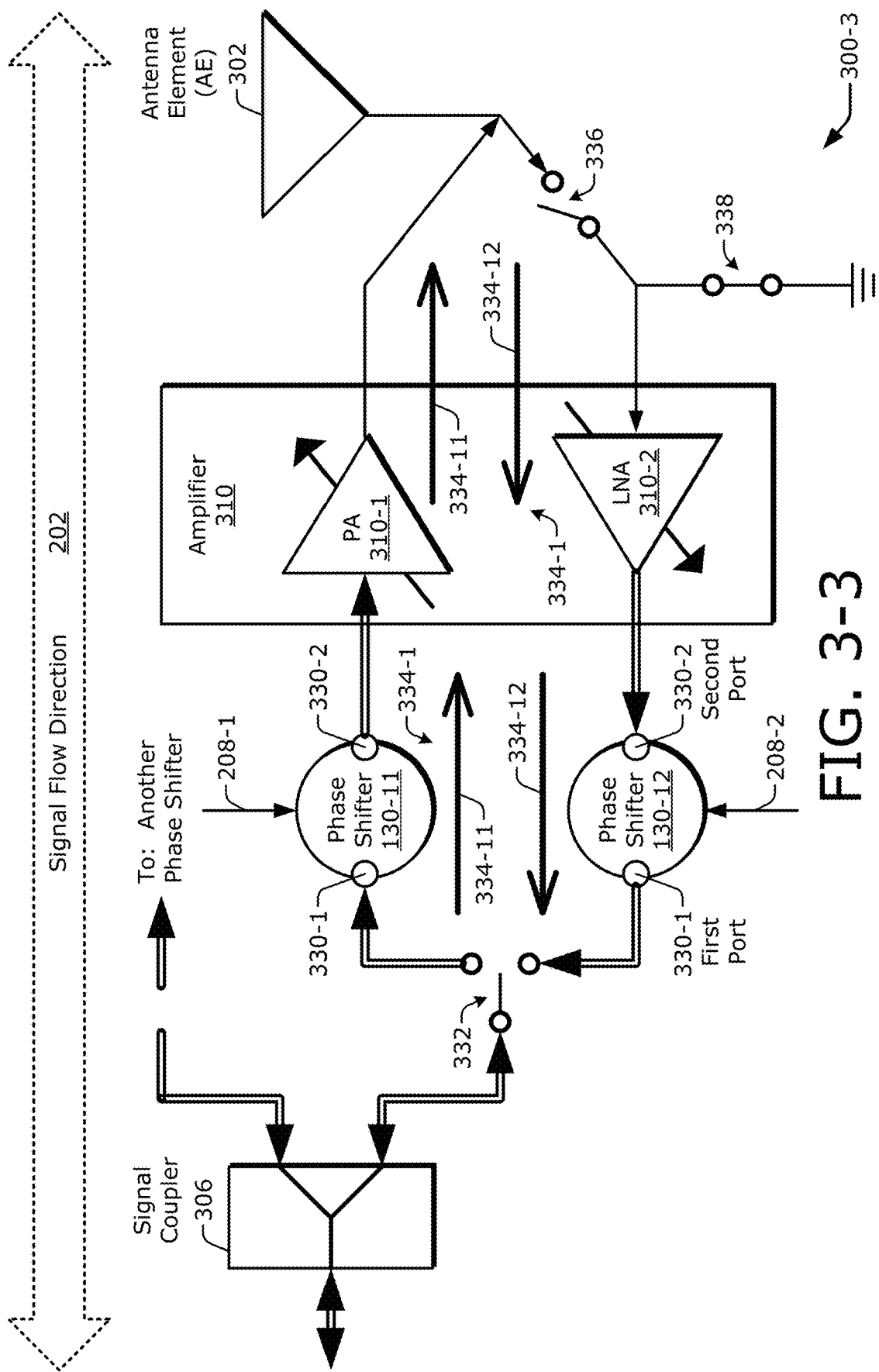

FIG. 3-1 illustrates generally at 300-1 the antenna array 122 being coupled to an example RF front-end 128 that includes multiple component chains 304-1, 304-2, 304-3, . . . , 304-$n$, with "n" representing a positive integer (e.g., two or more for beamforming) Here, each component chain 304 includes at least one phase shifter 130 (PS 130). The antenna array 122 includes multiple antenna elements 302-1, 302-2, 302-3, . . . , 302-$n$, with "n" representing a positive integer (e.g., two or more for beamforming) Each respective antenna element 302 (AE 302) of the multiple antenna elements 302-1 . . . 302-$n$ is coupled to a respective component chain 304 of the multiple component chains 304-1 . . . 304-$n$. For example, a first component chain 304-1 is coupled to a first antenna element 302-1, and a second component chain 304-2 is coupled to a second antenna element 302-2.

In example implementations, each component chain 304 of the multiple component chains 304-1 . . . 304-$n$ is coupled to a signal coupler 306. The signal coupler 306 can function as a combiner/splitter. For example, the signal coupler 306 can combine multiple signal versions accepted from the multiple component chains 304-1 . . . 304-$n$ into a combined signal for a receiving operation. The signal coupler 306 can also split a signal into multiple signal versions and provide the versions to the multiple component chains 304-1 . . . 304-$n$ for a transmitting operation.

As illustrated, each respective component chain 304 respectively includes a phase shifter 130 (PS 130), an amplifier 310, and at least one other component 308. However, a given component chain 304 can include more, fewer, or different components. The signal flow direction 202 along each component chain 304 can be bidirectional as indicated by the double-headed arrow. As shown, these physical components of a respective component chain 304 are coupled together in series between the signal coupler 306 and the respective corresponding antenna element 302 of the antenna array 122. The other component 308 is nearest the signal coupler 306, and the amplifier 310 is nearest the antenna element 302. The phase shifter 130 is therefore coupled between the other component 308 and the amplifier 310. However, the order of these physical components of a given component chain 304 may differ.

The amplifier 310 can be implemented in different manners. For example, the amplifier 310 can be implemented as a power amplifier (PA) (PA 310-1) for transmission operations or as a low-noise amplifier (LNA) (LNA 310-2) for reception operations. The other component 308 can be realized as a filter, another amplifier, a mixer, and so forth. The phase shifter 130 can therefore provide a phase-shifted signal to the PA 310-1 for amplification and forwarding to the corresponding antenna element 302 for emanation therefrom. The phase shifter 130 can also or instead accept an amplified signal from the LNA 310-2 for phase shifting and then forwarding to the other component 308, or for forwarding "directly" to the signal coupler 306 if no other component 308 is present.

In example operations, each respective component chain 304 adjusts or conditions a signal propagating between the signal coupler 306 and a respective antenna element 302. Thus, each respective component chain 304 modifies a signal to produce a respective signal version having a different respective phase or amplitude that is appropriate for providing to or accepting from a respective antenna element 302 to support a beamsteering operation. The phase shifter 130 performs phase shifting operations based on the phase control signal 208. The phase control signal 208 is representative of a phase shift amount (e.g., in degrees) that is targeted to be provided by the phase shifter 130. Amplification level differences that occur in the phase shifter 130 for different phase shift amounts can be compensated for responsive to the compensation value signal 210. As shown in FIG. 3-1, the amplifier 310 can perform a compensation operation based on the compensation value signal 210. Alternatively, a vector modulator 134 (e.g., of FIGS. 1 and 4-1 to 4-3) of the phase shifter 130 can perform a compensation operation based on the compensation value signal 210.

In FIG. 3-1, a signal 334 is depicted with regard to the component chain 304-1. The signal 334 can propagate along the component chain 304-1 between the signal coupler 306 and the antenna element 302-1. Other such signals can be propagating through other component chains. As indicated by the dashed appearance of the arrow representing the signal 334, the signal 334 can be realized as a bidirectional signal, a unidirectional signal, or a combination thereof as the signal 334 traverses different parts of the component chain 304. A bidirectional implementation of the signal 334 across the phase shifter 130 is described with reference to FIG. 3-2, and unidirectional implementations of the signal 334 across two phase shifters are described with reference to FIG. 3-3.

FIG. 3-2 illustrates generally at circuitry 300-2 an antenna element 302 coupled to a portion of a component chain 304 (e.g., of FIG. 3-1), which includes a phase shifter 130-2 that can be operated bidirectionally. As illustrated, the phase shifter 130-2 includes multiple ports: a first port 330-1 and a second port 330-2. The phase shifter 130-2 is coupled to the signal coupler 306 via the first port 330-1 and to the amplifier 310 via the second port 330-2. However, the orientation of the phase shifter 130-2 can be flipped such that the first port 330-1 is positioned closer to the antenna element 302 and the second port 330-2 couples the phase shifter 130-2 to the signal coupler 306. A switch 332 switchably couples the phase shifter 130-2 to the amplifier 310. The switch 332 includes a pole, which is coupled to the second port 330-2, and two throws: a top throw and a bottom throw. The switch 332 can selectively connect the second port 330-2 of the phase shifter 130-2 to an input of the PA 310-1 via the top throw or to an output of the LNA 310-2 via the bottom throw.

An output of the PA 310-1 is coupled to the antenna element 302. An input of the LNA 310-2 is coupled to the antenna element 302 via a switch 336. A switch 338 can couple the input of the LNA 310-2 to ground. As depicted in FIG. 3-2, the switches 336 and 338 are in an open state and a closed state, respectively, to enable a transmission operation. The switch 336 can be closed and the switch 338 can be opened to enable a reception operation. However, a different quantity or arrangement of switches can be implemented to couple the various physical components of the component chain to each other or to the antenna element 302.

In FIGS. 3-2 and 3-3, lines interconnecting different physical components can represent a quantity of wires or other electrical conductors. Thus, a double line can represent two wires, and a single wire can represent one wire. In some cases, a differential signal is propagated over the double lines, and a single-ended signal is propagated over the single lines. As shown in FIGS. 3-2 and 3-3, differential signals can be propagated to the left of—or on the processor side of—the amplifier 310. Single-ended signals can be propagated to the right of—or on the antenna side of—the amplifier 310. However, singled-ended signaling and differential signaling can be implemented differently. In example operations for the phase shifters of FIGS. 3-2 and 3-3, a signal 334 having an input phase enters one port of a phase shifter 130 and exits another port of the phase shifter 130 with the signal 334 having a delayed phase relative to the input phase to support beamsteering with the antenna array 122 (e.g., of FIG. 3-1).

In some implementations, a bidirectional signal 334-2 traverses the phase shifter 130-2. An example of this approach is depicted in FIG. 3-2. The bidirectional signal 334-2 propagates between the signal coupler 306 and the switch 332 and through the phase shifter 130-2. Thus, the phase shifter 130-2 can be used for both transmit and receive operations. Example implementations of bidirectional phase shifters are described herein below. FIG. 3-2 also depicts at least one unidirectional signal 334-1 propagating between the switch 332 and the antenna element 302. Specifically, a unidirectional transmission signal 334-11 propagates between the switch 332 and the antenna element 302 and through the PA 310-1. A unidirectional reception signal 334-12 propagates between the antenna element 302 and the switch 332 and through the LNA 310-2.

FIG. 3-3 illustrates generally at circuitry 300-3 an antenna element 302 coupled to a portion of a component chain 304 (e.g., of FIG. 3-1), which includes two phase shifters 130-11 and 130-12 that can each be operated unidirectionally. The circuitry 300-3 is similar to the circuitry 300-2 except that two unidirectional phase shifters are employed in the circuitry 300-3 instead of one bidirectional phase shifter as in the circuitry 300-2. In operation, a first phase control signal 208-1 establishes a first phase-shift setting for one unidirectional phase shifter 130-11 that is part of a transmit path. A second phase control signal 208-2 establishes a second phase-shift setting for another unidirectional phase shifter 130-12 that is part of a receive path. Example implementations of unidirectional phase shifters are described herein below.

As illustrated at a component-chain level, each of the two phase shifters 130-11 and 130-12 includes multiple ports: a first port 330-1 and a second port 330-2. The phase shifter 130-11 is coupled to the signal coupler 306 via the first port 330-1 thereof and to the amplifier 310 via the second port 330-2. The phase shifter 130-12 is coupled to the signal coupler 306 via the first port 330-1 thereof and to the amplifier 310 via the second port 330-2. However, the orientation of either or both phase shifters 130-11 or 130-12 can be flipped such that the first port 330-1 is positioned closer to the antenna element 302 and the second port 330-2 couples the respective phase shifter to the signal coupler 306. Thus, in some implementations a unidirectional phase shifter accepts a signal via the first port 330-1 and provides a phase-shifted signal via the second port 330-2. In other implementations, a unidirectional phase shifter accepts a signal via the second port 330-2 and provides a phase-shifted signal via the first port 330-1.

A switch 332 switchably couples the two phase shifters 130-11 and 130-12 to the signal coupler 306. The switch 332 includes a pole, which is coupled to the signal coupler 306, and two throws: a top throw and a bottom throw. The switch 332 can selectively connect the signal coupler 306 to the first port 330-1 of the phase shifter 130-11 via the top throw or connect the signal coupler 306 to the first port 330-1 of the phase shifter 130-12 via the bottom throw. The second port 330-2 of the phase shifter 130-11 is coupled to an input of the PA 310-1. An output of the PA 310-1 is coupled to the antenna element 302. The antenna element 302 is coupled to an input of the LNA 310-2 via the switch 336. An output of the LNA 310-2 is coupled to the second port 330-2 of the phase shifter 130-12. The switches 332, 336, and 338 can operate in terms of transmission and reception operations as described above with reference to FIG. 3-2. However, a different quantity or arrangement of switches can be implemented to couple the various physical components of the illustrated component chain to each other or to the antenna element 302.

In some implementations, at least one unidirectional signal 334-1 propagates through the components. As shown, two unidirectional signals 334-11 and 334-12 traverse the two phase shifters 130-11 and 130-12, respectively. A unidirectional transmit signal 334-11 propagates between the switch 332 and the PA 310-1 and through the phase shifter 130-11. Thus, the phase shifter 130-11 can be used for transmit operations. The unidirectional transmission signal 334-11 also propagates between the phase shifter 130-11 and the antenna element 302 and through the PA 310-1. A unidirectional reception signal 334-12 propagates between the antenna element 302 and the phase shifter 130-12 and through the LNA 310-2. The unidirectional transmit signal 334-12 also propagates between the LNA 310-2 and the switch 332 and through the phase shifter 130-12. Thus, the phase shifter 130-12 can be used for receive operations.

Figures 1, 4:
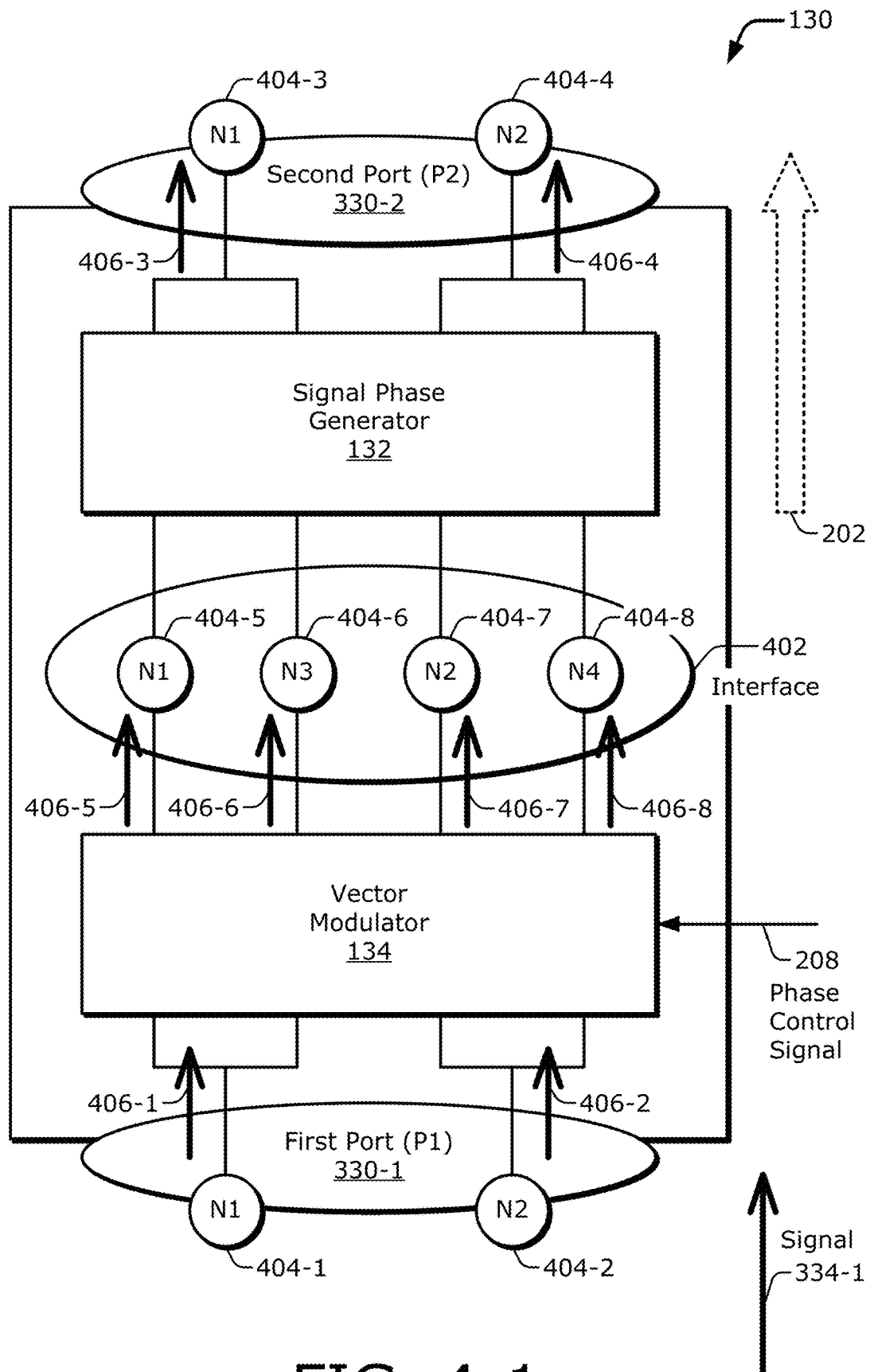
Figures 2, 4:
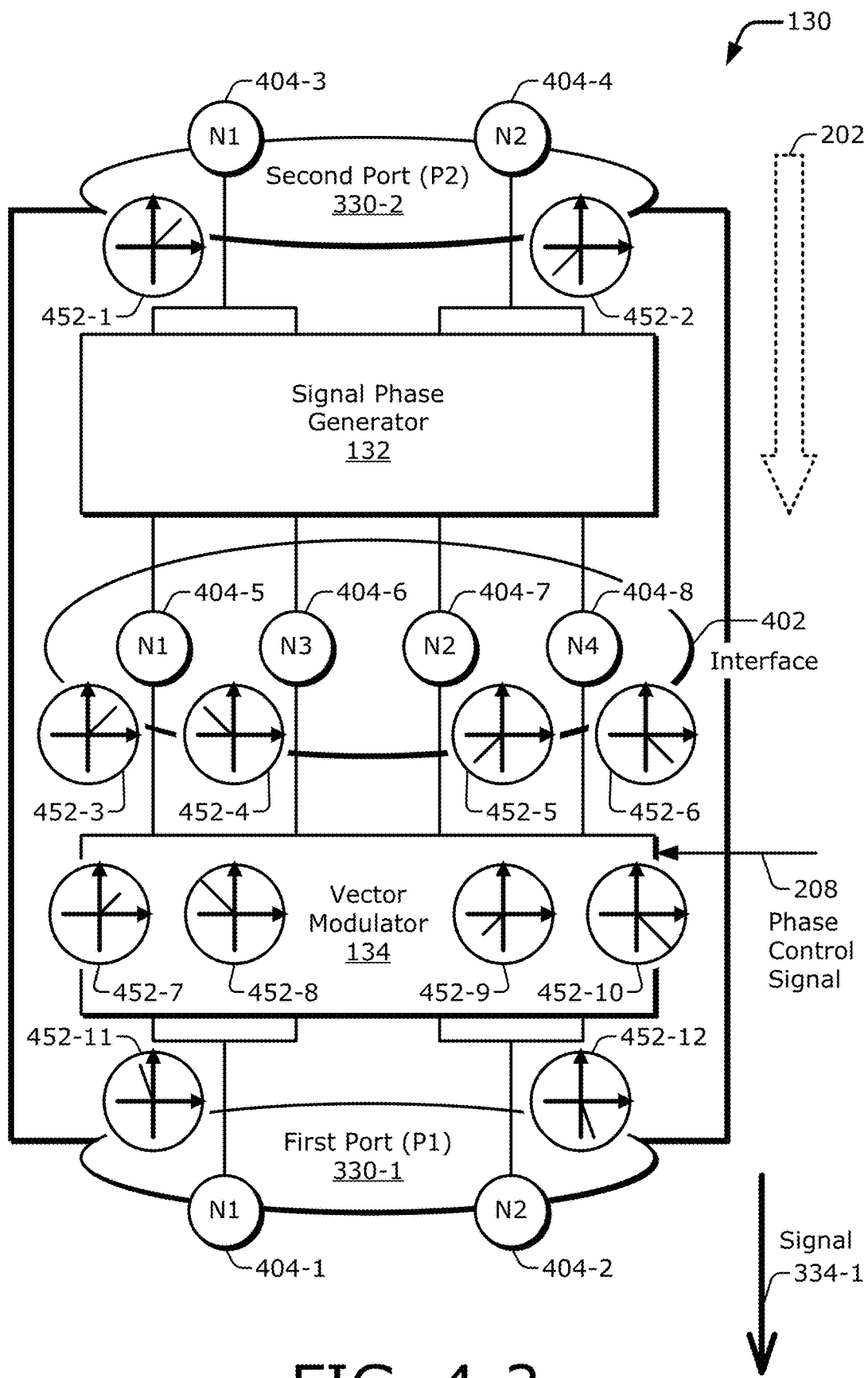
Figures 3, 4:
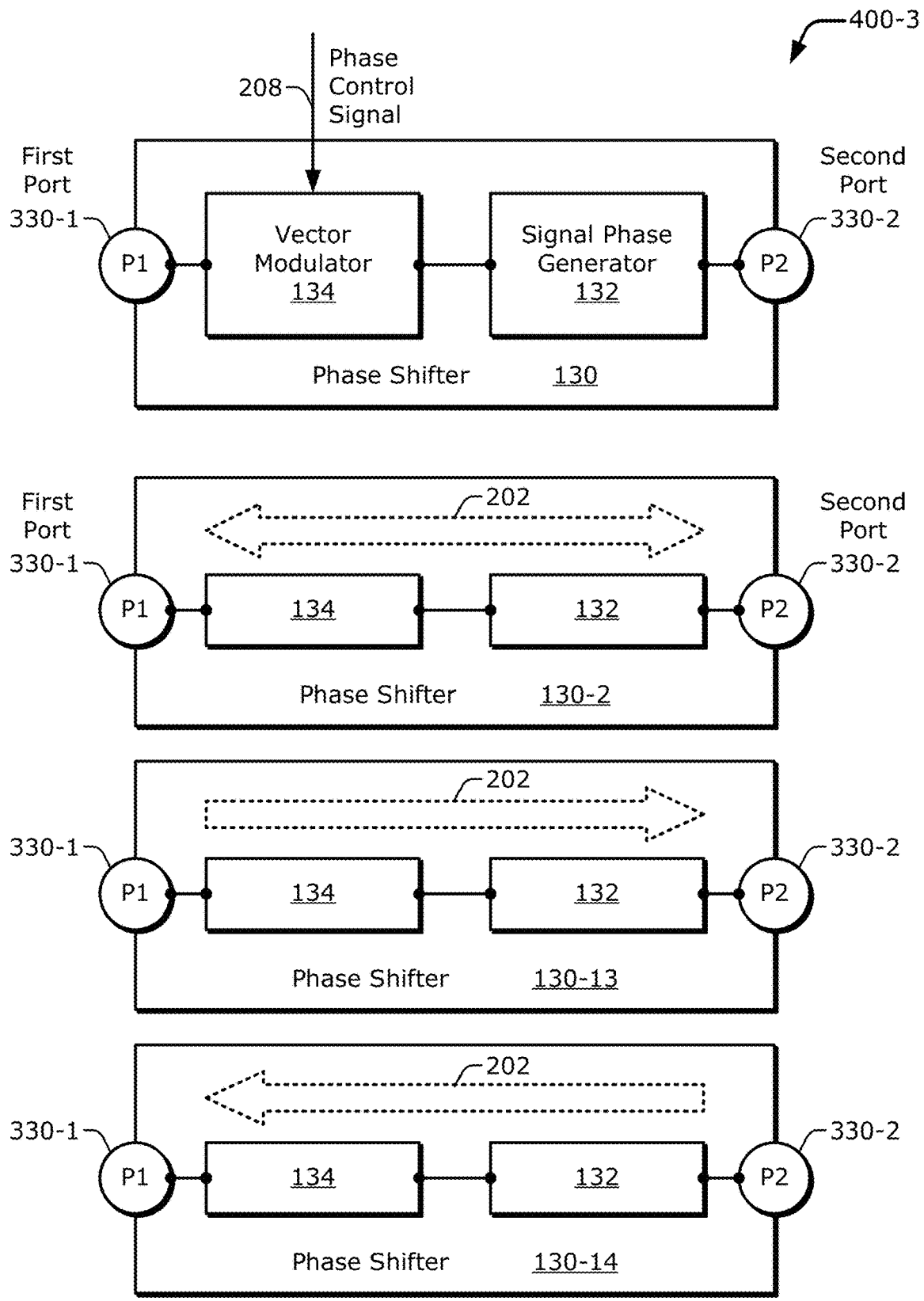

FIG. 4-1 illustrates an example phase shifter 130 including a signal phase generator 132, a vector modulator 134, an interface 402, and multiple ports 330-1 and 330-2. The phase shifter 130 includes a first port 330-1 (P1) and a second port 330-2 (P2) that enable the phase shifter 130 to couple to other components of a component chain 304 as described above with reference to FIGS. 3-1 to 3-3. As illustrated, the first port 330-1 is coupled to the vector modulator 134, and the second port 330-2 is coupled to the signal phase generator 132. The signal phase generator 132 is coupled to the vector modulator 134. In some implementations, the signal phase generator 132 is coupled to the vector modulator 134 via the interface 402. Thus, the interface 402 is disposed electrically between the signal phase generator 132 and the vector modulator 134. The phase shifter 130 includes multiple nodes 404-1, 404-2, ..., 404-7, 404-8. Although eight nodes 404-1 to 404-8 are explicitly depicted in FIG. 4-1 and described herein, a phase shifter 130 can include more or fewer such nodes.

In example implementations, the first port 330-1 includes one or more nodes, the second port 330-2 includes one or more nodes, and the interface 402 includes two or more nodes. In a single-ended signaling environment, the first and second ports 330-1 and 330-2 can each include one node, and the interface 402 can include two nodes. In a differential signaling environment, the first and second ports 330-1 and 330-2 can each include two nodes, and the interface 402 can include four nodes. By way of example, the phase shifter 130 of FIG. 4-1 can shift a phase of a differential signal that propagates between the first port 330-1 and the second port 330-2.

Accordingly, the first port 330-1 includes two nodes N1 and N2: a first node 404-1 and a second node 404-2, respectively. The second port 330-2 also includes two nodes N1 and N2: a third node 404-3 and a fourth node 404-4, respectively. The interface 402 includes four nodes N1, N2, N3, and N4: a fifth node 404-5, a seventh node 404-7, a sixth node 404-6, and an eighth node 404-8, respectively. As shown in various FIGS. (e.g., FIGS. 4-1 and 6 through 8), the interface 402 can include multiple connections that are depicted as lines, such as communication lines. The lines can be realized using wires, traces, metallic pathways, or other electrical conductors. Thus, each respective node of the four nodes N1, N2, N3, and N4 of the interface 402 (e.g., the fifth node 404-5, the seventh node 404-7, the sixth node 404-6, and the eighth node 404-8, respectively) can be realized as at least a point along, or a length of, the corresponding electrical conductor extending between the signal phase generator 132 and the vector modulator 134. As described below with reference to FIGS. 5-1 and 5-2, the two nodes N1 and N2 of the first and second ports 330-1 and 330-2 can correspond to a differential signal having phases of zero (0) degrees and 180 degrees. The four nodes N1, N2, N3, and N4 of the interface 402 can correspond to two differential signals having phases of zero (0), 180, 90, and 270 degrees.

The phase shifter 130 of FIG. 4-1 is described with a unidirectional signal 334-1. Here, the phase shifter 130 accepts the unidirectional signal 334-1 at the first port 330-1 and provides a phase-shifted version of the unidirectional signal 334-1 at the second port 330-2. However, the described principles are also applicable to a phase shifter 130 that is implemented in a bidirectional manner and to a phase shifter 130 that processes a unidirectional signal 334-1 that propagates from the second port 330-2 to the first port 330-1. Further, although two and four components 406 of the unidirectional signal 334-1 are illustrated in FIG. 4-1 at the two ports and the one interface, respectively, a different quantity of signal components 406 can alternatively be implemented. With a differential signaling implementation, each node 404 can comprise a plus node or a minus node. For example, the first node 404-1 and the third node 404-3 can each comprise a plus node, and the second node 404-2 and the fourth node 404-4 can each comprise a minus node.

In an example scenario for FIG. 4-1, the vector modulator 134 operates on the unidirectional signal 334-1 before the signal phase generator 132 along a signal flow direction 202 from the first port 330-1 to the second port 330-2. Initially, the phase shifter 130 accepts the unidirectional signal 334-1 at the first port 330-1. The unidirectional signal 334-1 includes two components: a first component 406-1 and a second component 406-2. Thus, the first component 406-1 of the unidirectional signal 334-1 propagates through the first node 404-1 (node "N1"), and the second component 406-2 propagates through the second node 404-2 (node "N2"). At the first and second nodes 404-1 and 404-2, the first and second components 406-1 and 406-2 of the unidirectional signal 334-1 have different phases, such as 0° and 180°.

The vector modulator 134 adjusts at least one amplitude of the first and second components 406-1 and 406-2 of the unidirectional signal 334-1 responsive to the phase control signal 208. The vector modulator 134 outputs four components of the unidirectional signal 334-1: a fifth component 406-5, a sixth component 406-6, a seventh component 406-7, and an eighth component 406-8. These four components have adjusted amplitudes based on operation of the vector modulator 134. However, no additional phase has been generated yet.

Accordingly, the fifth to eighth components 406-5 to 406-8 may correspond to two phases at an output of the vector modulator 134. For instance, the fifth and sixth components 406-5 and 406-6 may correspond to a first phase, such as 0°, and the seventh and eighth components 406-7 and 406-8 may correspond to a second phase, such as 180°.

The fifth component 406-5 propagates from the vector modulator 134, through the fifth node 404-5 (node "N1"), and to the signal phase generator 132. The seventh component 406-7 propagates from the vector modulator 134, through the seventh node 404-7 (node "N2"), and to the signal phase generator 132. The sixth component 406-6 propagates from the vector modulator 134, through the sixth node 404-6 (node "N3"), and to the signal phase generator 132. The eighth component 406-8 propagates from the vector modulator 134, through the eighth node 404-8 (node "N4"), and to the signal phase generator 132. Thus, the signal phase generator 132 accepts the fifth to eighth components 406-5 to 406-8 from the vector modulator 134 via the nodes N1, N2, N3, and N4 of the interface 402.

The signal phase generator 132 generates at least one additional phase for at least one component 406 of the unidirectional signal 334-1. For example, the signal phase generator 132 can generate 90° and 270° phases from the 0° and 180° phases. Because at least some of the multiple components 406-5 to 406-8 have an amplitude that is already adjusted by the vector modulator 134 at the interface 402, the signal phase generator 132 produces different phases that have different relative amplitudes. Thus, the four phases, which are present at least internal of the signal phase generator 132, can be "recombined" to produce two phases while realizing a phase shift for the unidirectional signal 334-1. The fifth and sixth components 406-5 and 406-6, which have at least one different phase within the signal phase generator 132 as compared to such components at the interface 402, are combined at the third node 404-3 (node "N1") to produce a third component 406-3 with a single phase. The seventh and eighth components 406-7 and 406-8, which have at least one different phase within the signal phase generator 132 as compared to such components at the interface 402, are combined at the fourth node 404-4 (node "N2") to produce a fourth component 406-4 with a single phase. The third and fourth components 406-3 and 406-4 can have phases that are separated by 180°, such as 0° and 180°.

The 0° and 180° phases of the first and second components 406-1 and 406-2 at the first port 330-1 may be different relative to the 0° and 180° phases of the third and fourth components 406-3 and 406-4 at the second port 330-2. However, the unidirectional signal 334-1 can remain a differential signal at the second port 330-2 with a phase that is shifted relative to the differential signal at the first port 330-1 to support beamforming operations. Different phases in the phase shifter 130, and especially within the signal phase generator 132 thereof, are described further below with reference to FIGS. 4-2, 5-1, and 5-2. These phases are depicted graphically using example phasors in FIG. 4-2 and textually using example numerals in FIGS. 5-1 and 5-2.

FIG. 4-2 illustrates an example phase shifter 130 including a signal phase generator 132 and a vector modulator 134. FIG. 4-2 depicts multiple phases of multiple components of a signal via multiple phasors 452-1 ... 452-12. Although the multiple components 406-1 ... 406-8 of a signal 334 are explicitly depicted in FIG. 4-1, these components are omitted from FIG. 4-2 for clarity. The phase shifter 130 of FIG. 4-2 is described with a unidirectional signal 334-1. Here, the phase shifter 130 accepts the unidirectional signal 334-1 at the second port 330-2 and provides a phase-shifted version of the unidirectional signal 334-1 at the first port 330-1. However, the described principles are also applicable to a phase shifter 130 that is implemented in a bidirectional manner and to a phase shifter 130 that processes a unidirectional signal 334-1 that propagates from the first port 330-1 to the second port 330-2.

In an example scenario for FIG. 4-2, the signal phase generator 132 operates on the unidirectional signal 334-1 before the vector modulator 134 along a signal flow direction 202 from the second port 330-2 to the first port 330-1. To visually represent relative phases and magnitudes of the different signal components at various nodes, each phase of a signal component is depicted with a phasor diagram 452. Initially, the phase shifter 130 accepts the unidirectional signal 334-1 at the second port 330-2. At the third node 404-3, a corresponding signal component of the unidirectional signal 334-1 has a 45° phase as represented by a phasor 452-1. A phase of 45° is used in this example so that the phase angles are not obscured by the axes of the phasor diagrams. With differential signaling, a corresponding signal component at the fourth node 404-4 has a 225° phase as represented by a phasor 452-2.

The signal phase generator 132 accepts the two signal components with 45° and 225° phases. The signal phase generator 132 generates two additional phases and spreads the four phases across four signal components. This distribution of the phases is described further below with reference to FIGS. 5-1 and 5-2. The signal components with the four phases are separated by 90° increments and are output by the signal phase generator 132 at the interface 402. As shown, a signal component at the fifth node 404-5 has a 45° phase as represented by a phasor 452-3, and a signal component at the sixth node 404-6 has a 135° phase as represented by a phasor 452-4. A phase difference between the signal components at the fifth and sixth nodes 404-5 and 404-6 is therefore 90°. A signal component at the seventh node 404-7 has a 225° phase as represented by a phasor 452-5, and a signal component at the eighth node 404-8 has a 315° phase as represented by a phasor 452-6. As indicated by the four phasors 452-3 to 452-6, amplitudes of the signal components of the unidirectional signal 334-1 that are propagating through the interface 402 have substantially equal magnitudes before the vector modulator 134 operates on the unidirectional signal 334-1.

The vector modulator 134 adjusts an amplitude of at least one component of the unidirectional signal 334-1 responsive to the phase control signal 208. In this example, the vector modulator 134 decreases the amplitudes of the two signal components propagating through the fifth and seventh nodes 404-5 and 404-7. This is graphically represented with relatively shorter phasor arrows at a phasor 452-7 and a phasor 452-9, respectively. In contrast, the vector modulator 134 increases the amplitudes of the two signal components propagating through the sixth and eighth nodes 404-6 and 404-8. This is graphically represented with relatively longer phasor arrows at a phasor 452-8 and a phasor 452-10, respectively.

The vector modulator 134 outputs four components of the unidirectional signal 334-1 with the four components having the depicted amplitudes and phase angles at the four phasors 452-7 to 452-10. The signal components are "recombined" for outputting at the first port 330-1 as a differential signal. At the first node 404-1, after the amplitude adjustments by the vector modulator 134, the signal components from the fifth and sixth nodes 404-5 and 404-6 are combined to produce a signal component having a 110° phase as represented by a phasor 452-11. At the second node 404-2, after the amplitude adjustments by the vector modulator 134, the signal components from the seventh and eighth nodes 404-7 and 404-8 are combined to produce a signal component having a 290° phase as represented by a phasor 452-12. In this manner, the phase shifter 130 can shift a phase of the unidirectional signal 334-1 by 65° (e.g., from 45° to 110° and from 225° to 290°). Thus, a phase of a version of a wireless signal that is to be transmitted or that has been received via an antenna element can be shifted to support a beamforming operation.

FIG. 4-3 illustrates generally at 400-3 an example phase shifter 130 including a signal phase generator 132 and a vector modulator 134. As depicted at the upper portion of FIG. 4-3, the phase shifter 130 includes multiple ports: a first port 330-1 (P1) and a second port 330-2 (P2). As shown, the first port 330-1 is coupled to the vector modulator 134, and the second port 330-2 is coupled to the signal phase generator 132. However, these couplings to the ports may be swapped. The interface 402 between the signal phase generator 132 and the vector modulator 134 that is depicted in FIGS. 4-1 and 4-2 is omitted in FIG. 4-3.

In example operations, the signal phase generator 132 converts a first quantity of phases (e.g., one or two) of a signal to a second quantity of phases (e.g., two or four, respectively) of the signal. The signal phase generator 132 in particular, the vector modulator 134 in particular, or the phase shifter 130 generally may recombine signal components to convert "back" to the first quantity of phases from the second quantity of phases before forwarding a phase-shifted signal to another physical component along a component chain. Thus, the signal phase generator 132 generates one or more phases for a signal. The vector modulator 134 adjusts an amplitude of at least one phase of the signal based on the phase control signal 208. For example, by increasing or decreasing an amplitude of at least one of an in-phase signal (I signal component) or a quadrature signal (Q signal component) using the vector modulator 134, the phase shifter 130 can shift a phase of a signal propagating through the phase shifter between the first and second ports 330-1 and 330-2.

As depicted at the lower portion of FIG. 4-3, signals may flow in different directions across the phase shifter 130 for different implementations. These signal flow directions 202 are indicated by dashed arrows. As shown in a phase shifter 130-2, signal flow across the phase shifter may be bidirectional between the first and second ports 330-1 and 330-2, which is indicated by the bidirectional arrow of the signal flow direction 202. As shown in a phase shifter 130-13, signal flow across the phase shifter may be unidirectional from the first port 330-1 to the second port 330-2, which is indicated by the unidirectional, rightward-pointing arrow of the signal flow direction 202. Consequently, with the depicted architecture, the vector modulator 134 may operate on a propagating signal before the signal phase generator 132 operates on the propagating signal as represented by the signal flow direction 202 of the phase shifter 130-13. As shown in a phase shifter 130-14, signal flow across the phase shifter may be unidirectional from the second port 330-2 to the first port 330-1, which is indicated by the unidirectional, leftward-pointing arrow of the signal flow direction 202. Consequently, the vector modulator 134 may operate on a propagating signal after the signal phase generator 132 operates on the propagating signal as represented by the signal flow direction 202 of the phase shifter 130-14. With respect to the bidirectional signal flow direction 202 of the phase shifter 130-2, a temporal order of signal processing between the signal phase generator 132 and the vector modulator 134 depends on whether a transmission operation or a reception operation is occurring and which port 330 is coupled closer to an antenna element.

Although not so illustrated, a signal phase generator 132 may be implemented as two "separate" unidirectional signal phase generators. In terms of the RF front-end 128 (e.g., of FIG. 3-1), the first port 330-1 may be coupled to the other component 308 and thus closer to the signal coupler 306 and the transceiver 126 (e.g., of FIG. 2), and the second port 330-2 may be coupled to the amplifier 310 and thus closer to the antenna array 122. Alternatively, the second port 330-2 may be coupled to the other component 308 and thus closer to the signal coupler 306 and the transceiver 126, and the first port 330-1 may be coupled to the amplifier 310 and thus closer to the antenna array 122. Various arrangements or architectures of a signal phase generator 132 and a vector modulator 134 are described below with reference to FIGS. 6 to 13-2. However, example implementations of a signal phase generator 132 are described next with reference to FIGS. 5-1 and 5-2.

Figures 1, 5:
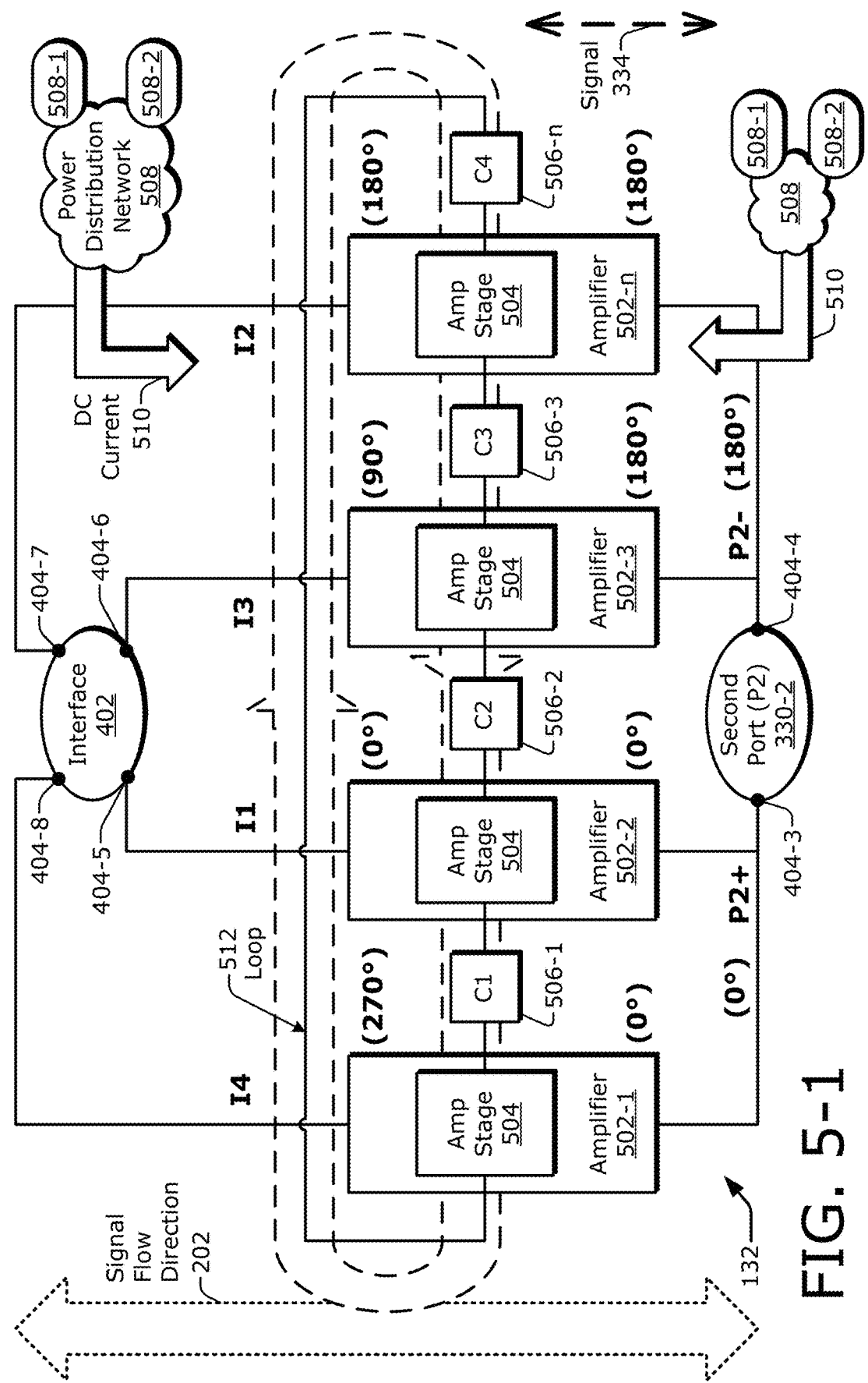
Figures 2, 5:
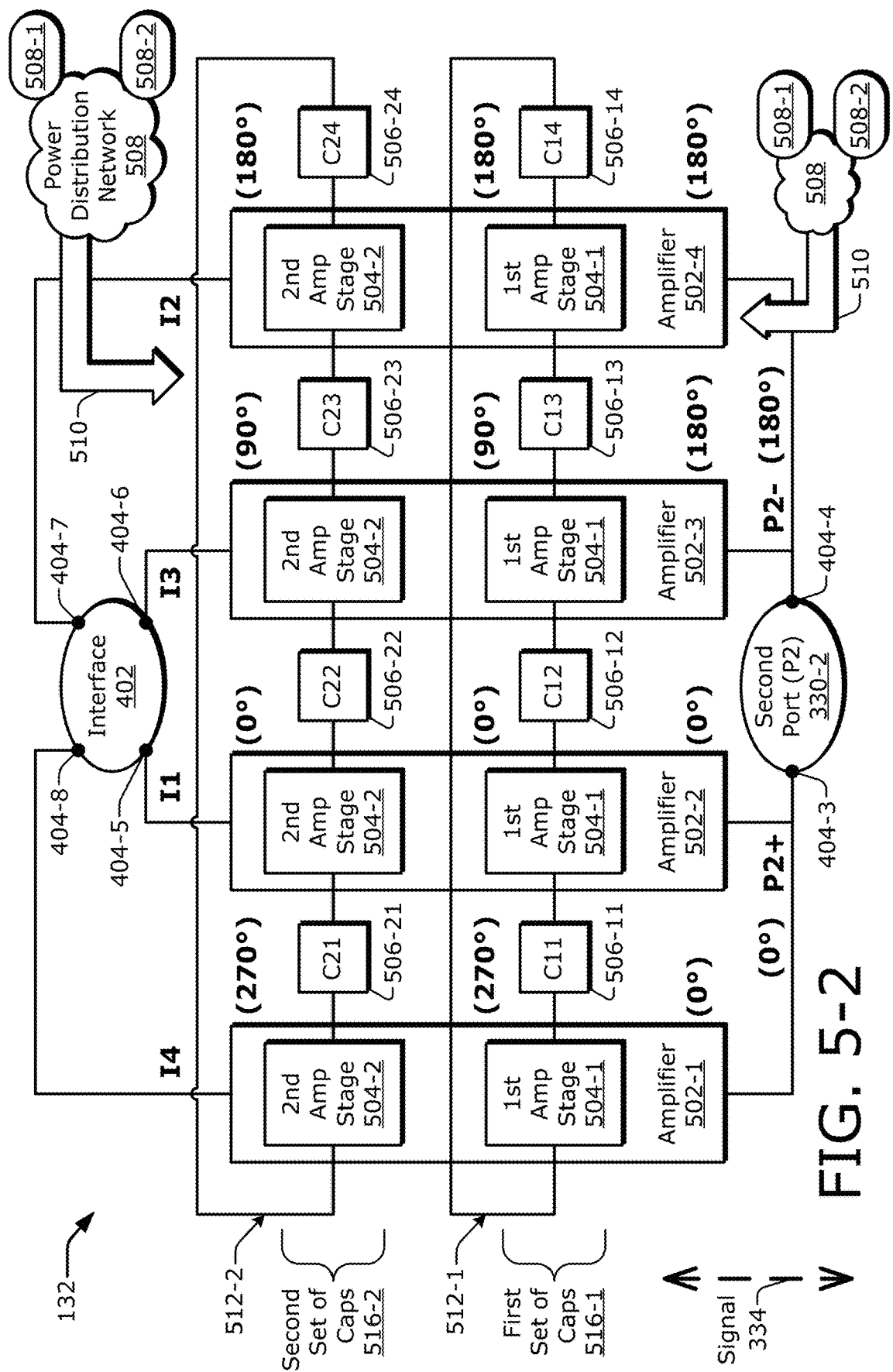

FIG. 5-1 illustrates a schematic diagram of an example signal phase generator 132 including multiple capacitors and multiple amplifiers having at least one amplification stage per amplifier. Thus, the signal phase generator 132 includes multiple amplifiers 502-1, 502-2, 502-3, . . . , 502-$n$, with "n" representing an integer greater than one. Each amplifier 502 includes at least one amplification stage 504 (Amp Stage 504). The signal phase generator 132 also includes multiple capacitors 506-1, 506-2, 506-3, . . . , 506-$n$, with "n" representing an integer greater than one. As shown, a first capacitor 506-1 is also denoted as "C1," a second capacitor 506-2 is also denoted as "C2," a third capacitor 506-3 is also denoted as "C3," and a fourth capacitor 506-$n$ is also denoted as "C4" (e.g., for an example in which n=4). The "n" of the amplifiers and the "n" of the capacitors can correspond to the same or different integers. Thus, although four amplifiers and four capacitors are explicitly shown, greater or fewer of either or both of such components may alternatively be included in a given signal phase generator 132.

In some implementations, each node 404 corresponds to a different phase of a signal 334 propagating through the signal phase generator 132. As such, a quantity of nodes at one side of the signal phase generator 132 can differ from a quantity of nodes at another side of the of the signal phase generator 132 to enable generation of at least one phase for the propagating signal 334. For instance, a first quantity of nodes at one side of the signal phase generator 132 may be one while a second quantity of nodes at another side may be two or three. In the example illustrated in FIG. 5-1, the propagating signal 334 traverses two nodes 404-3 and 404-4 and thus can have up to two different phases at the second port 330-2 (P2), which are represented by "P2+" and "P2−," respectively. The propagating signal 334 traverses four nodes 404-5, 404-6, 404-7, and 404-8 and thus can have up to four different phases at the interface 402, which are represented by "I1," "I3," "I2," and "I4," respectively.

In some aspects, the signal 334 comprises a differential signal. In such a case, the two phases at the two nodes 404-3 to 404-4 can correspond to 0° and 180° for a differential in-phase signal component (differential in-phase (I) signal component). As the signal 334 propagates through the multiple amplifiers 502-1 to 502-$n$ from the second port 330-2 to the interface 402, two additional phases are generated. The four phases at the four nodes 404-5, 404-6, 404-7, and 404-8 can respectively correspond to 0°, 90°, 180° and 270° for a differential I signal component and a differential quadrature signal component (differential quadrature (Q) signal component). In some contexts, a 0°-phase signal is referred to as an "I+" signal, a 90°-phase signal is referred to as a "Q+" signal, a 180°-phase signal is referred to as an "I−" signal, and a 270°-phase signal is referred to as a "Q−" signal. The phases are indicated relative to each other on one side of the multiple amplifiers 502-1 to 502-$n$. Thus, the phases at the third and fourth nodes 404-3 and 404-4 are 180° apart from each other. Similarly, the phases at the fifth through eighth nodes 404-5 through 404-8 are 90° apart from each other. However, the "0° phase" at the third node 404-3 may be different from the "0° phase" at the fifth node 404-5. At a given amplification stage 504, four signal components of the signal 334 distributed across the multiple amplifiers 502-1 to 502-4 have relative phases of zero (0) degrees, 90 degrees, 180 degrees, and 270 degrees.

In example implementations, the multiple amplifiers 502-1 to 502-n are coupled into columnar circuits in a parallel arrangement between the second port 330-2 and the interface 402. The multiple capacitors 506-1 to 506-n couple the multiple amplifiers 502-1 to 502-n together to form a loop 512. Each respective capacitor 506 of the multiple capacitors 506-1 to 506-n is coupled between a respective pair of consecutive amplifiers to form the loop 512. For example, the first capacitor 506-1 is coupled between a first amplifier 502-1 and a second amplifier 502-2, which comprise a respective pair of consecutive amplifiers with respect to the loop 512. The second capacitor 506-2 is coupled between the second amplifier 502-2 and a third amplifier 502-3, which comprise another respective pair of consecutive amplifiers. The third capacitor 506-3 is coupled between the third amplifier 502-3 and a fourth amplifier 502-4, with "n" equal to four. Also, the fourth capacitor 506-4 is coupled between the fourth amplifier 502-4 and the first amplifier 502-1, which comprise yet another pair of consecutive amplifiers with respect to the loop 512. By starting at a given amplifier (e.g., the first amplifier 502-1) and returning to the given amplifier, the capacitor couplings form the loop 512 through the multiple amplifiers 502-1 to 502-n.

In an example operation, from the second port 330-2 to the interface 402, the signal 334 is propagated through the signal phase generator 132 to generate at least one additional phase for the signal 334. Due to the multiple capacitors 506-1 to 506-n that form the loop 512, phases of the propagating signal 334 are distributed over the multiple amplifiers 502-1 to 502-n. More specifically, the relative phases of signal phase components can be distributed or interpolated across the multiple amplifiers 502-1 to 502-n. As shown in parentheses, four phases (e.g., 0°, 90°, 180°, and 270°) for both in-phase and quadrature differential signal components are generated at the interface 402 from two phases (e.g., 0° and) 180° of the in-phase differential signal component at the second port 330-2. Thus, four signal components are produced from two signal components. As described below, each capacitor 506 can be coupled between the respective amplification stage 504 of two consecutive amplifiers (e.g., the second amplifier 502-2 and the third amplifier 502-3). The capacitor 506 may be coupled between, for instance, an input terminal of one amplification stage 504 and an output terminal of another amplification stage 504 of the two consecutive amplifiers. Example implementations for an amplification stage 504 are described below, starting with reference to FIG. 6.

In a further example operation, in an "opposite" direction from the interface 402 to the second port 330-2, a reverse phase generation operation occurs. Thus, in this opposite direction, two differential signals of a same phase can be accepted as input signals at the interface 402 and can be amplified by the multiple amplifiers 502-1 to 502-n in a manner that shifts a phase of one of the input signals by 90 degrees and that produces a combined differential signal at the second port 330-2. This reverse operation can be utilized, for instance, for implementations that enable bidirectional signal flow, as indicated by the double-headed arrow for the signal flow direction 202. Some described implementations of the signal phase generator 132 are bidirectional and some are unidirectional, as is indicated below.

During operation, a power distribution network 508 (PDN 508) provides a direct-current (DC) current 510 (DC current 510) that flows through each amplifier 502 to realize an active signal phase generator 132. The power distribution network 508 can include at least a first power distribution node and a second power distribution node. More specifically, to provide the DC current 510, each amplifier 502 can be coupled between a supply voltage node 508-1 and a ground node 508-2. Based on an amplification provided by the powered multiple amplifiers 502-1 to 502-n, a gain can be implemented or an increased signal strength can be achieved between the second port 330-2 and the interface 402 to prevent, or at least reduce, attenuation caused by the signal phase generator 132 in particular or the phase shifter 130 in general (e.g., of FIGS. 2 and 4-1 to 4-3).

Implementations explicitly illustrated in FIG. 5-1 include one amplification stage 504 at each of the four depicted amplifiers 502-1 to 502-n. However, alternative approaches may be implemented. For example, a different quantity of amplifiers may be employed. If, for instance, eight amplifiers are employed, phases of the signal 334 are distributed over the eight amplifiers such that each consecutive phase is separated by 45 degrees instead of 90 degrees. Additionally or alternatively, multiple stages can be employed. Generally, a single amplification stage can provide signal phase generation at some given bandwidth. To increase the usable bandwidth, one or more amplification stages can be added to the single amplification stage at each amplifier. Although more than two amplification stages can be used, an example two-amplification-stage implementation is described with reference to FIG. 5-2 for clarity.

FIG. 5-2 illustrates a schematic diagram of another example signal phase generator 132 including multiple capacitors and multiple amplifiers that employ at least two amplification stages per amplifier 502. Although a quantity of amplifiers and capacitors can be greater or fewer than four (4), both have a quantity of four in many examples described herein for simplicity of explanation. In the illustrated example, each amplifier 502 includes two or more amplification stages. Generally, as the quantity of amplification stages increases, a usable signaling bandwidth increases for the signal phase generator 132. As shown, each amplifier 502 includes two stages: a first amplification stage 504-1 (1st Amp Stage 504-1) and a second amplification stage 504-2 (2nd Amp Stage 504-2). In some aspects, the first amplification stage 504-1 can be implemented as a main amplification stage with the second amplification stage 504-2 implemented as a cascode amplification stage or a cascade amplification stage.

In example implementations, a loop 512 is created with the multiple capacitors for each amplification stage 504. Thus, in FIG. 5-2, the signal phase generator 132 includes a first loop 512-1 and a second loop 512-2. The first amplification stage 504-1 corresponds to the first loop 512-1 and a first set of capacitors 516-1. The first set of capacitors 516-1 includes multiple capacitors 506-11, 506-12, 506-13, and 506-14. As shown for the first set of capacitors 516-1 of the first amplification stage 504-1, a first capacitor 506-11 is also denoted as "C11," a second capacitor 506-12 is also denoted as "C12," a third capacitor 506-13 is also denoted as "C13," and a fourth capacitor 506-14 is also denoted as "C14." A second set of capacitors 516-2 includes multiple capacitors 506-21, 506-22, 506-23, and 506-24. As shown for the second set of capacitors 516-2 of the second amplification stage 504-2, a first capacitor 506-21 is also denoted as "C21," a second capacitor 506-22 is also denoted as "C22," a third capacitor 506-23 is also denoted as "C23," and a fourth capacitor 506-24 is also denoted as "C24."

With multiple amplification stages, the multiple amplifiers 502-1 to 502-4 are coupled into parallel columns between the second port 330-2 and the interface 402. Example implementations of columnar circuits to realize the amplifiers are described below with reference to FIG. 6. The first amplification stage 504-1 is coupled to the second port 330-2, and the second amplification stage 504-2 is coupled to the interface 402. The multiple capacitors 506-11 to 506-14 of the first set of capacitors 516-1 couple the multiple amplifiers 502-1 to 502-4 together at the first amplification stage 504-1 to form the first loop 512-1. Each respective capacitor 506 of the multiple capacitors 506-11 to 506-14 is coupled between a respective pair of consecutive amplifiers at the first amplification stage 504-1 to form the first loop 512-1. For example, the first capacitor 506-11 is coupled between the first amplification stage 504-1 of the first amplifier 502-1 and the first amplification stage 504-1 of the second amplifier 502-2, which amplifiers comprise a respective pair of consecutive amplifiers with respect to the first loop 512-1. The second capacitor 506-12 is coupled between the first amplification stage 504-1 of the second amplifier 502-2 and the first amplification stage 504-1 of the third amplifier 502-3. The third capacitor 506-13 is coupled between the first amplification stage 504-1 of the third amplifier 502-3 and the first amplification stage 504-1 of the fourth amplifier 502-4. Also, the fourth capacitor 506-14 is coupled between the first amplification stage 504-1 of the fourth amplifier 502-4 and the first amplification stage 504-1 of the first amplifier 502-1, which comprise another pair of consecutive amplifiers with respect to the first loop 512-1.

By starting at the first amplification stage 504-1 of a given amplifier (e.g., the first amplifier 502-1) and returning to the first amplification stage 504-1 of the given amplifier, the capacitive couplings form the first loop 512-1 through the first amplification stages 504-1 of the multiple amplifiers 502-1 to 502-4. Similarly, the multiple capacitors 506-21 to 506-24 of the second set of capacitors 516-2 couple the multiple amplifiers 502-1 to 502-4 together at the second amplification stage 504-2 to form the second loop 512-2. Each respective capacitor 506 of the multiple capacitors 506-21 to 506-24 is coupled between a respective pair of consecutive amplifiers at the second amplification stage 504-2 to form the second loop 512-2.

Adding more amplification stages 504 per amplifier 502 can further widen or flatten the response of the signal phase generator 132 across a targeted frequency bandwidth. Like in FIG. 5-1, the phases are indicated relative to each other on a given side of the multiple amplifiers 502-1 to 502-4 or at a given stage of amplification. Thus, the phases along a given amplification stage 504 are 90° apart from each other as shown. However, the "0° phase" at the first amplification stage 504-1 may be different from the "0° phase" at the second amplification stage 504-2. Example circuit components that can be used to implement the first and second amplification stages 504-1 and 504-2 of the multiple amplifiers 502-1 to 502-4 are described next with reference to FIG. 6.

Figure 6:
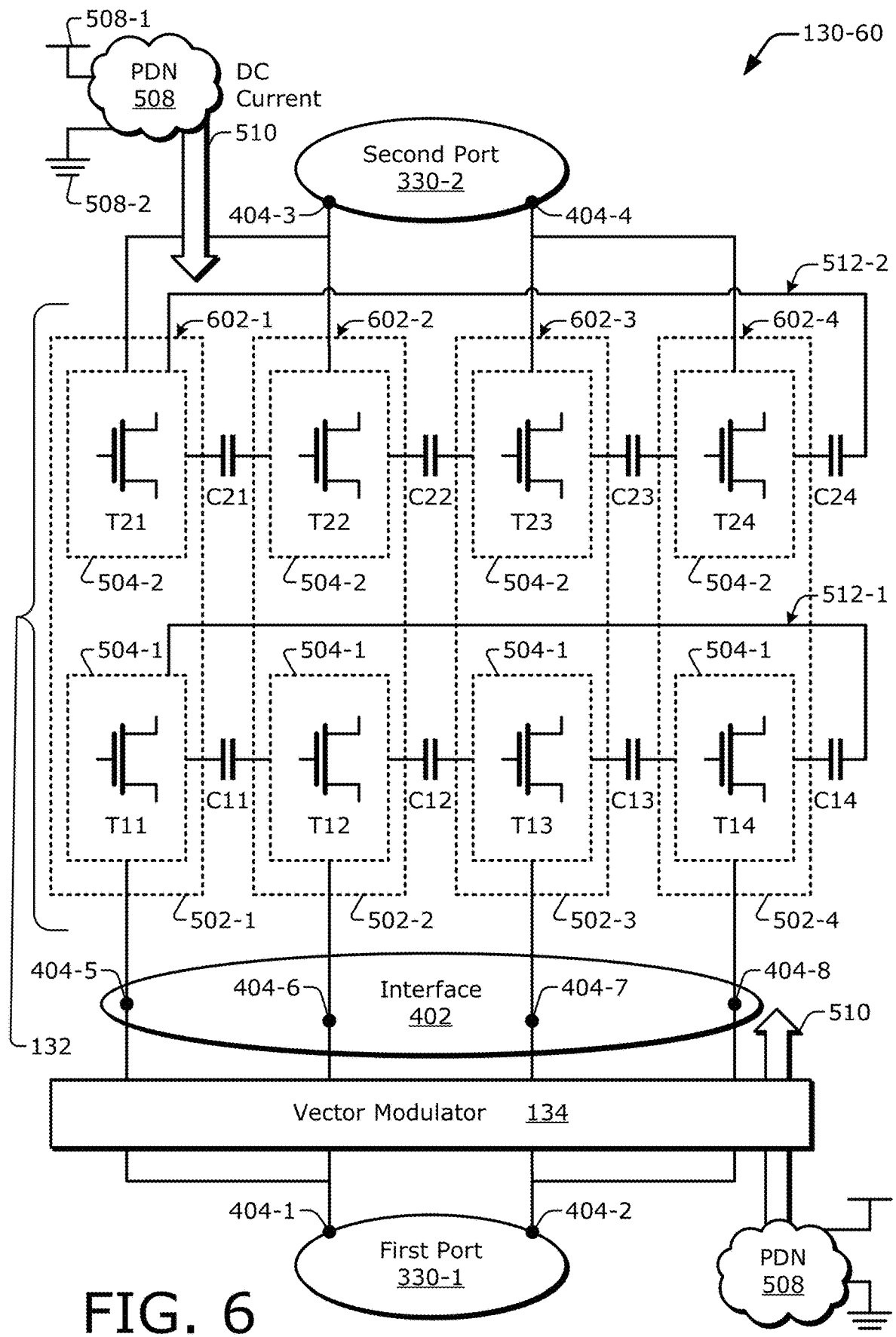
FIG. 6 illustrates a schematic diagram of an example phase shifter including a signal phase generator with multiple amplifiers having at least two amplification stages that are each implemented using at least one transistor and that are arranged into multiple columnar circuits.

FIG. 6 illustrates a schematic diagram of an example phase shifter 130-60 including a signal phase generator 132 with multiple amplifiers having at least two amplification stages that are each implemented using at least one transistor. The phase shifter 130-60 includes a vector modulator 134 as well as the signal phase generator 132. The phase shifter 130-60 includes a first port 330-1, a second port 330-2, and an interface 402. As shown, the first port 330-1 includes two nodes: a first node 404-1 and a second node 404-2. The interface 402 includes four nodes: a fifth node 404-5, a sixth node 404-6, a seventh node 404-7, and an eighth node 404-8. The second port 330-2 includes two nodes: a third node 404-3 and a fourth node 404-4.

In example implementations, the multiple amplifiers 502-1 to 502-4 of the signal phase generator 132 are realized as multiple columnar circuits 602-1 to 602-4 extending between the second port 330-2 and the interface 402, with each columnar circuit 602 including one or more transistors. The four columnar circuits 602-1, 602-2, 602-3, and 602-4 are coupled in a parallel arrangement between the second port 330-2 and the interface 402. Specifically, a first columnar circuit 602-1 including the first amplifier 502-1 is coupled between the third node 404-3 of the second port 330-2 and the fifth node 404-5 of the interface 402. A second columnar circuit 602-2 including the second amplifier 502-2 is coupled between the third node 404-3 and the sixth node 404-6. Also, a third columnar circuit 602-3 including the third amplifier 502-3 is coupled between the fourth node 404-4 and the seventh node 404-7. Further, a fourth columnar circuit 602-4 including the fourth amplifier 502-4 is coupled between the fourth node 404-4 and the eighth node 404-8.

Each amplification stage 504 of each amplifier 502 can be implemented with at least one transistor ("T ##"). As shown, the first amplification stage 504-1 of the first, second, third, and fourth amplifiers 502-1, 502-2, 502-3, and 502-4 is respectively implemented with a transistor T11, T12, T13, and T14 in each of the respective columnar circuits 602-1, 602-2, 602-3, and 602-4. Thus, the capacitor C11 is coupled between the transistors T11 and T12, the capacitor C12 is coupled between the transistors T12 and T13, the capacitor C13 is coupled between the transistors T13 and T14, and the capacitor C14 is coupled between the transistors T14 and T11 to form the first loop 512-1.

The second amplification stage 504-2 of the first, second, third, and fourth amplifiers 502-1, 502-2, 502-3, and 502-4 is respectively implemented with a transistor T21, T22, T23, and T24 in each of the respective columnar circuits 602-1, 602-2, 602-3, and 602-4. Thus, the capacitor C21 is coupled between the transistors T21 and T22, the capacitor C22 is coupled between the transistors T22 and T23, the capacitor C23 is coupled between the transistors T23 and T24, and the capacitor C24 is coupled between the transistors T24 and T21 to form the second loop 512-2. In the first or second amplification stages 504-1 or 504-2, each capacitor can be coupled between an input terminal of one transistor and an output terminal of another transistor, which other transistor is a consecutive transistor of a pair of transistors along the respective first or second loop 512-1 or 512-2.

The power distribution network 508, a supply voltage node 508-1, and a ground node 508-2 are depicted twice in FIG. 6 with the DC current 510 arrows pointing in opposite directions. In some implementations, the power distribution node to which a columnar circuit 602 is coupled is selectively switched to enable bidirectional signal flow across the transistors of the signal phase generator 132. Each transistor (T ##) is illustrated in FIG. 6 as a metal-oxide-semiconductor (MOS) field-effect transistor (FET) (MOSFET). However, each amplification stage 504 may be implemented with another type of transistor, such as a junction FET (JFET), a bipolar junction transistor (BJT), and so forth. Example terminal connections for MOSFETs, example transistor polarity types, and example amplifier configurations are described with reference to FIGS. 7 and 8.

In example implementations, values of one or more circuit elements can be selected based on a target frequency of operation (e.g., a center frequency or frequency range) of a phase shifter 130. At least one transistor (T ##) is associated with a transconductive (Gm) value representative of a transconductance of the transistor. At least one capacitor (C ##) is associated with a capacitive value representative of a capacitance of the capacitor. In some cases, at least one of the transconductive (Gm) value of the transistor or the capacitive value of the capacitor is based on a target frequency of operation of the phase shifter. For instance, a product of the transconductive (Gm) value and the capacitive value can be proportional to the target frequency of operation of the phase shifter. As described with reference to FIGS. 7 and 8, the signal amplification of the signal phase generator 132 can be accomplished by inputting one or more signal phase components of the signal 334-2 or 334-1 to the multiple transistors T11 to T14 or T21 to T24 via gate terminals or channel terminals thereof.

Figure 7:
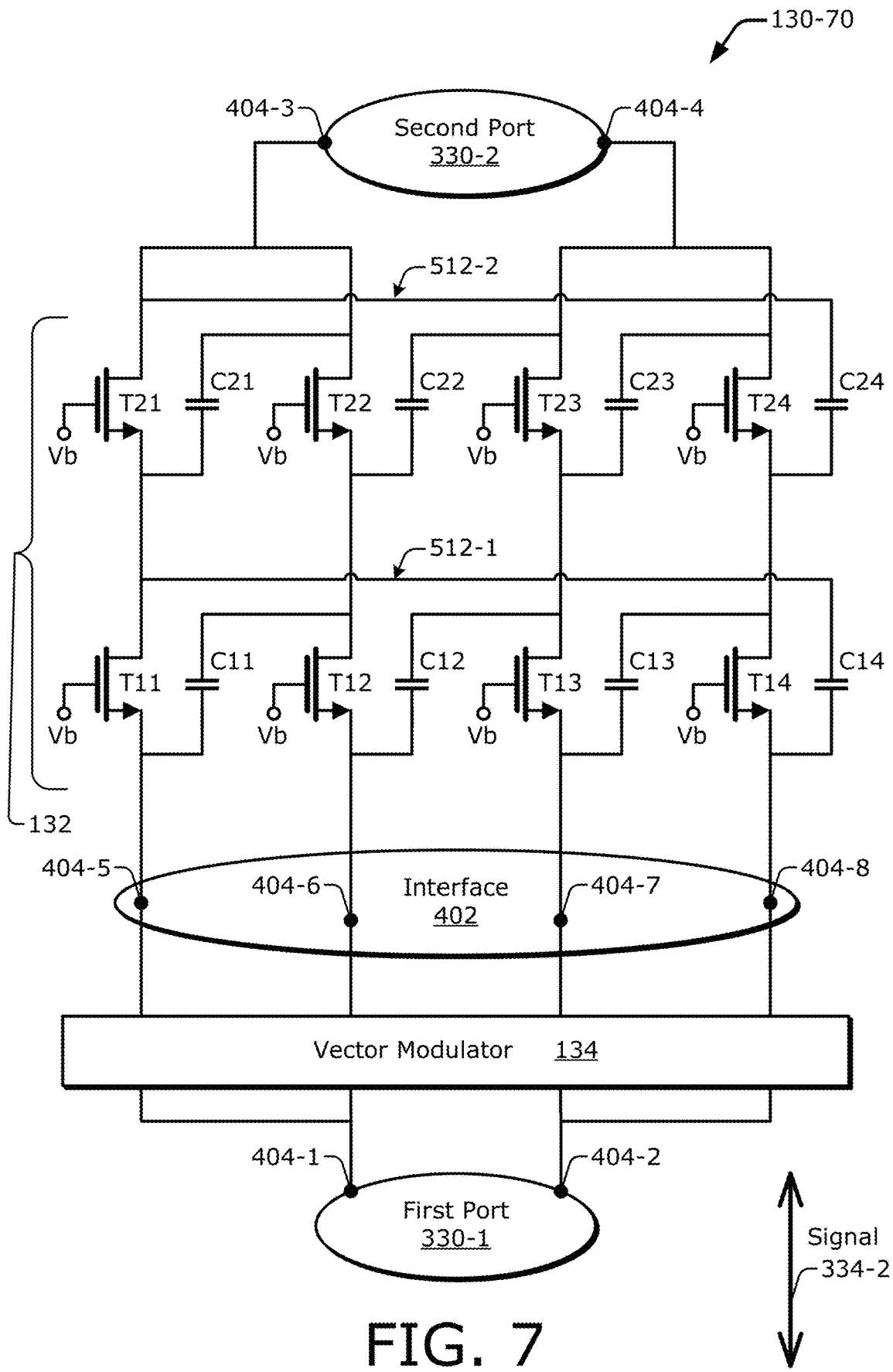
FIG. 7 illustrates a circuit diagram of a phase shifter including an example signal phase generator including multiple capacitors and multiple amplifiers having two common-gate amplification stages per amplifier.

FIG. 7 illustrates a circuit diagram of a phase shifter 130-70 including an example signal phase generator 132 including multiple capacitors and multiple amplifiers having two common-gate (CG) amplification stages per amplifier. Thus, each transistor of each amplification stage is configured as a common-gate amplifier. Each capacitor is coupled between an input terminal of one transistor and an output terminal of another transistor, which other transistor is a consecutive transistor along the first loop 512-1 or the second loop 512-2. Each FET has multiple terminals: a gate terminal and at least one channel terminal. For example, each FET can include the two channel terminals: a source terminal and a drain terminal. Thus, a circuit element can be coupled to a given FET via at least one terminal of multiple terminal types, with each terminal type selected from a group including a gate terminal, a source terminal, or a drain terminal.

In example implementations, the transistors T11, T12, T13, and T14 are coupled together in a parallel "arrangement" between the second port 330-2 and the interface 402 as a first amplification stage. The transistors T21, T22, T23, and T24 are coupled together in a parallel "arrangement" between the second port 330-2 and the interface 402 as a second amplification stage. The transistors T11 and T21, the transistors T12 and T22, the transistors T13 and T23, and the transistors T14 and T24 are coupled together into four respective columnar circuits (e.g., the four columnar circuits 602-1 to 602-4 of FIG. 6) that are arrayed in a parallel manner between two power distribution nodes (not shown in FIG. 7). Each transistor can be biased via the gate terminal thereof using a bias voltage "Vb." The bias voltage Vb can bias the transistor into an analog range that enables amplification of signals propagating through a channel thereof. Each gate terminal can also be AC-coupled to ground using a capacitor (not shown). Although circuitry described herein utilizes n-channel FETs by way of example, p-channel FETs may alternatively be employed.

In the phase shifter 130-70, the transistors of both amplification stages are configured as common-gate (CG) amplifiers. Accordingly, input terminals and output terminals of the transistors correspond to the channel terminals thereof— e.g., the source terminals and the drain terminals. Each capacitor is coupled between a pair of consecutive transistors via the input terminal of one transistor and the output terminal of the other transistor of the pair of consecutive transistors. From left-to-right in FIG. 7, each capacitor of both amplification stages is coupled from an input terminal on the left to an output terminal on the right. For instance, for signals propagating from the interface 402 to the second port 330-2, the capacitor C11 is coupled between the input terminal of the transistor T11 and the output terminal of the transistor T12. In this example, the input terminal of the transistor T11 corresponds to the source terminal thereof, and the output terminal of the transistor T12 corresponds to the drain terminal thereof. Due to the bidirectional nature of the CG-plus-CG implementation, a terminal of a transistor may function as an input terminal for the bidirectional signal 334-2 for at least one operational mode and as an output terminal the bidirectional signal 334-2 for another operational mode. Here, operational modes can include a reception mode of operation and a transmission mode of operation.

Thus, the capacitor C11 is coupled between the source terminal of the transistor T11 and the drain terminal of the transistor T12. The capacitor C12 is coupled between the source terminal of the transistor T12 and the drain terminal of the transistor T13. The capacitor C13 is coupled between the source terminal of the transistor T13 and the drain terminal of the transistor T14. Further, the capacitor C14 is coupled between the source terminal of the transistor T14 and the drain terminal of the transistor T11 to form the first loop 512-1. Similarly, the capacitor C21 is coupled between the source terminal of the transistor T21 and the drain terminal of the transistor T22. The capacitor C22 is coupled between the source terminal of the transistor T22 and the drain terminal of the transistor T23. Also, the capacitor C23 is coupled between the source terminal of the transistor T23 and the drain terminal of the transistor T24. Further, to form the second loop 512-2, the capacitor C24 is coupled between the source terminal of the transistor T24 and the drain terminal of the transistor T21.

Using a CG-plus-CG configuration for the two amplification stages as shown in FIG. 7 enables a bidirectional signal flow for at least the signal phase generator 132 portion of the phase shifter 130-7 as represented by the double-headed arrow for the bidirectional signal 334-2. As described above, connection to a supply voltage node 508-1 or a ground node 508-2 on both sides of at least the transistor columns can be switchably controlled to selectively enable bidirectional signal flow. In example operations, the signal 334-2 can flow from the interface 402 to the second port 330-2. For example, at least one phase of the signal 334-2 can propagate from the fifth node 404-5 to the source terminal of the transistor T11, through the channel thereof, and to the drain terminal thereof. During this propagation, and based on the capacitor couplings of the four capacitors C11, C12, C13, and C14, phases of the signal 334-2 are distributed over the four transistors T11, T12, T13, and T14. From the drain terminal of the transistor T11, the at least one phase of the signal 334-2 continues propagating to the source terminal of the transistor T21, through the channel thereof, and to the drain terminal thereof. During this propagation, and based on the capacitor couplings of the four capacitors C21, C22, C23, and C24, phases of the signal 334-2 are distributed over the four transistors T21, T22, T23, and T24. The at least one phase of the signal 334-2 at the drain terminal of the transistor T21 is combined with another phase of the signal 334-2 from the drain terminal of the transistor T22 at the third node 404-3 for forwarding from the second port 330-2.

Figure 8:
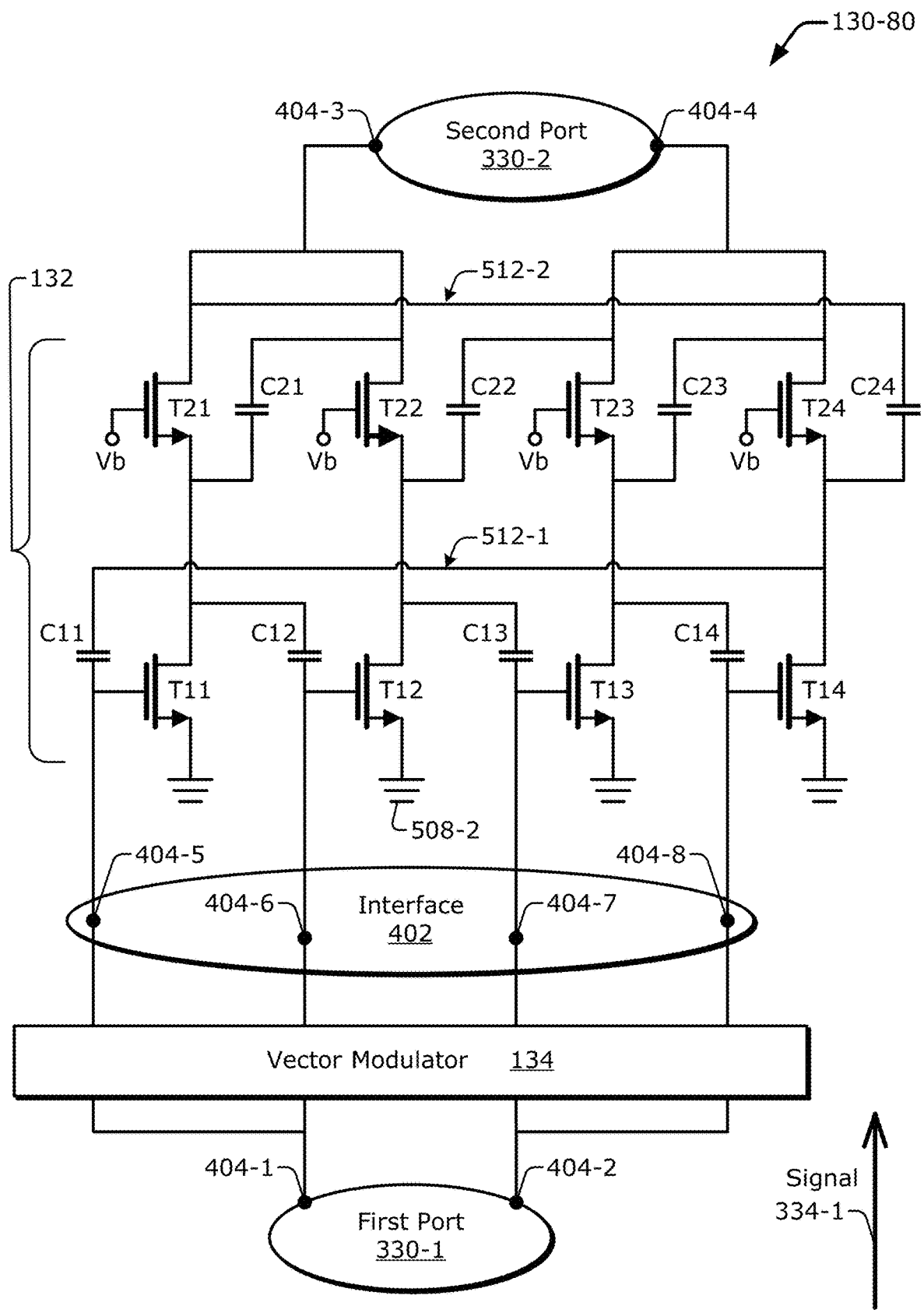
FIG. 8 illustrates a circuit diagram of a phase shifter including an example signal phase generator including multiple capacitors and multiple amplifiers having a common-source amplification stage and a common-gate amplification stage per amplifier.

FIG. 8 illustrates a circuit diagram of a phase shifter 130-80 including an example signal phase generator 132 including multiple capacitors and multiple amplifiers having a common-source (CS) amplification stage and a common-gate (CG) amplification stage per amplifier. The signal phase generator 132 of the phase shifter 130-80 is similar to the signal phase generator 132 of the phase shifter 130-70 of FIG. 7. However, the transistors T11, T12, T13, and T14 of the first amplification stage are configured as common-source (CS) amplifiers in FIG. 8. Thus, for each of these CS-configured transistors, an input terminal corresponds to the gate terminal thereof, and an output terminal corresponds to the drain terminal thereof. As shown, the source terminal of each transistor of the first amplification stage is coupled to a ground node 508-2.

Like the signal phase generator 132 of FIG. 7, each capacitor is coupled between an input terminal of one transistor and an output terminal of another transistor, which other transistor is a consecutive transistor along the first loop 512-1 or the second loop 512-2. However, a direction of capacitive coupling is different for the CS-configured transistors T11 to T14 as compared to the CG-configured transistors T21 to T24. For example, from left-to-right between the first and second amplifier columnar circuits, the capacitor C21 is coupled from the input terminal (e.g., the source terminal) of the transistor T21 to the output terminal (e.g., the drain terminal) of the transistor T22. In contrast, still from left-to-right between the first and second amplifier columnar circuits, the capacitor C12 is coupled from the output terminal (e.g., the drain terminal) of the transistor T11 to the input terminal (e.g., the gate terminal) of the transistor T12. Thus, the capacitive coupling direction is "reversed" for the transistors T11 to T14 relative to that of the transistors T21 to T24 to account for the effects of the common-source (CS) amplifier configuration. With a common-source amplifier, the transistor flips the sign or polarity of the propagating signal 180 degrees, which is comparable to a negative transconductance (Gm) for the respective transistor. To counteract this negative transconductance (Gm), a direction of the capacitive coupling of the first loop 512-1 is likewise flipped.

With a reversed capacitive coupling direction, the capacitors C11 to C14 are coupled to form the first loop 512-1 as follows. The capacitor C12 is coupled between the drain terminal of the transistor T11 and the gate terminal of the transistor T12. The capacitor C13 is coupled between the drain terminal of the transistor T12 and the gate terminal of the transistor T13. The capacitor C14 is coupled between the drain terminal of the transistor T13 and the gate terminal of the transistor T14. Further, the capacitor C11 is coupled between the drain terminal of the transistor T14 and the gate terminal of the transistor T11 to form the first loop 512-1.

Using a CS-plus-CG configuration for the two amplification stages results in a unidirectional signal flow for at least the signal phase generator 132 portion of the phase shifter 130-80 as represented by the single-headed arrow for the unidirectional signal 334-1. In example operations, the signal 334-1 can flow from the interface 402 to the second port 330-2. For example, at least one phase of the signal 334-1 can propagate from the fifth node 404-5 to the gate terminal of the transistor T11, be passed to the channel thereof, and then propagated to the drain terminal thereof. During this signal flow, and based on the capacitive couplings of the four capacitors C11, C12, C13, and C14, phases of the signal 334-1 are distributed over the four transistors T11, T12, T13, and T14 to thereby generate at least one additional phase for the signal 334-1. From the drain terminal of the transistor T11, the at least one phase of the signal 334-1 continues propagating to the source terminal of the transistor T21, through the channel thereof, and to the drain terminal thereof. During this propagation, and based on the capacitive couplings of the four capacitors C21, C22, C23, and C24, phases of the signal 334-1 are distributed over the four transistors T21, T22, T23, and T24. The at least one phase of the signal 334-1 at the drain terminal of the transistor T21 is combined with another phase of the signal 334-1 from the drain terminal of the transistor T22 at the third node 404-3 for forwarding from the second port 330-2.

Two example implementations for a signal phase generator 132 portion of a phase shifter 130 are described above with reference to FIGS. 7 and 8. Different example implementations for a vector modulator 134, and the associated relationship with a signal phase generator 132 to realize a phase shifter 130, are described with reference to FIGS. 9 to 13-2.

Figure 9:
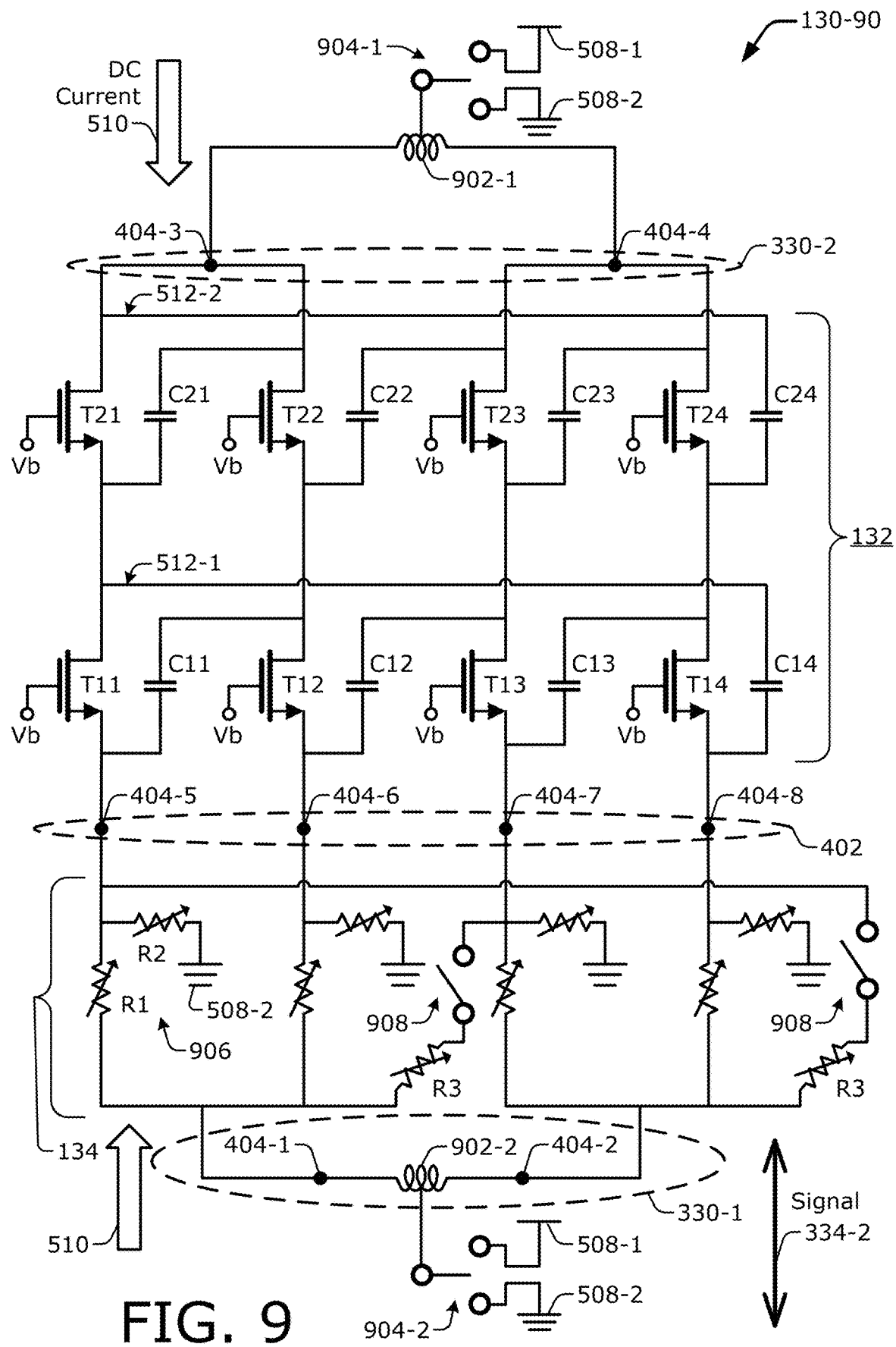
FIG. 9 illustrates an example phase shifter including a signal phase generator and a passive vector modulator that is implemented using resistors.

FIG. 9 illustrates an example phase shifter 130-90 including a signal phase generator 132 and a passive vector modulator 134 that is implemented using resistors (R). The phase shifter 130-90 is comparable to the phase shifter 130-70 (of FIG. 7) because both employ a CG-CG configuration for the two amplification stages of each amplifier branch. However, an example implementation for the vector modulator 134 that includes multiple voltage dividers is depicted in FIG. 9.

Generally, the phase shifter 130-90 receives power by being coupled between the power supply node 508-1 and the ground node 508-2 via a switch 904. The second port 330-2 is switchably coupled to the power supply node 508-1 or the ground node 508-2 via at least one inductor 902-1 and a switch 904-1. The interface 402 is coupled between the signal phase generator 132 and one side of the vector modulator 134. Another side of the vector modulator 134 is coupled to the first port 330-1. The first port 330-1 is switchably coupled to the ground node 508-2 or the power supply node 508-1 via at least one inductor 902-2 and a switch 904-2. During operation for one signaling direction, the DC current 510 can flow "downward" from the power supply node 508-1 through the switch 904-1, through the phase shifter 130-90, through the switch 904-2, and to the ground node 508-2. During operation for an opposite signaling direction for bidirectional functionality, the DC current 510 can flow "upward" from the inductor 902-2 to the inductor 902-1 by changing the positions of the two switches 904-1 and 904-2. In the example of FIG. 9, the DC current 510 flows through both the amplifier branches of the signal phase generator 132 and the vector modulator 134 of the phase shifter 130-90.

In example implementations, the vector modulator 134 is coupled to the signal phase generator 132 at the interface 402 via the fifth through the eighth nodes 404-5 to 404-8. The vector modulator 134 includes multiple portions respectively corresponding to the multiple amplifier columnar circuits of the signal phase generator 132. The vector modulator 134 includes multiple voltage dividers formed from resistors R; each resistor R may be implemented as an adjustable resistor of multiple adjustable resistors. Each respective portion of the vector modulator 134 includes a respective voltage divider. Each voltage divider includes a pair of adjustable resistors of the multiple adjustable resistors. As shown, there are four voltage dividers, one for each amplifier branch of the signal phase generator 132. Each voltage divider can adjust an amplitude of a signal component, and thus a respective phase, of the signal 334-2 propagating through the respective voltage divider. For instance, a voltage divider 906 includes two resistors: a resistor R1 and a resistor R2. The resistor R1 is coupled between a first node 404-1 of the first port 330-1 and a fifth node 404-5 of the interface 402. The resistor R2 is coupled between the fifth node 404-5 and the ground node 508-2.

In operation, the vector modulator 134 is therefore dividing at least one voltage to adjust an amplitude of a signal component, and thus at least one phase, of the signal 334-2. The voltage divider 906 can attenuate an amplitude of a component of a signal flowing between the first node 404-1 and the fifth node 404-5. The level of attenuation is adjustable by employing adjustable resistors. As depicted, each resistor R comprises an adjustable resistor having a resistive value that can be adjusted based on the phase control signal 208 (e.g., of FIGS. 2, 3-1 to 3-3, and 4-1 to 4-3). Each adjustable resistor R can be implemented using one or more transistors, one or more "static" resistive elements, at least one switch, combinations thereof, and so forth. For example, each individual one of multiple transistors or resistive elements can be coupled with a respective switch that can engage or disengage each respective transistor or resistive element. The multiple transistors or resistive elements can be coupled together in parallel with respect to each other so that different resistive values can be established for each adjustable resistor R by opening or closing a respective switch that is coupled in series with each individual transistor or resistive element. Alternatively, the multiple transistors or resistive elements can be coupled together in series with respect to each other with each also being individually coupled in parallel with a switch to engage or disengage the individual component to establish a resistive value for the adjustable resistor R. However, adjustable resistors can be constructed using other approaches.

The vector modulator 134 also includes two resistors R3 that can switchably couple a port node at one polarity to a voltage divider of another polarity. For instance, the resistor R3 on the left is coupled in series with a switch 908 between the first node 404-1 and the seventh node 404-7. Thus, the resistor R3 can couple the first node 404-1 having one polarity (e.g., a plus part or a minus part) of a differential signal to the seventh node 404-7 that corresponds to the second node 404-2 having the other polarity (e.g., a minus part or a plus part, respectively). These two resistors R3 can be connected or disconnected from the circuitry using a respective one of the two switches 908. If the two resistors R3 are connected, a 180-degree diversion path is produced that enables the vector modulator 134 to shift the phase shift range from 0-to-90 degrees to 90-to-180 degrees. Generally, an adjustable resistor (e.g., the resistor R1) of a pair of adjustable resistors (e.g., the resistors R1 and R2) can be coupled between a first plus node (e.g., the first node 404-1) and a second plus node (e.g., the fifth node 404-5) of the phase shifter 130. Further, at least one adjustable resistor (e.g., the resistor R3) of multiple adjustable resistors is coupled between the first plus node (e.g., the first node 404-1) and a minus node (e.g., the seventh node 404-7) of the phase shifter 130.

As represented by the double-headed arrow for the bidirectional signal 334-2, both the signal phase generator 132 and the vector modulator 134 of the phase shifter 130-90 are bidirectional. Hence, the phase shifter 130-90 can be operated bidirectionally, like in the example component chain of FIG. 3-2. However, the DC current 510 flows through the resistors R of the vector modulator 134, as well as the transistors of the signal phase generator 132. Consequently, the resistors R of the vector modulator 134 affect the transconductance (Gm) values of the transistors and introduce some non-linearities. In contrast, the vector modulator 134 depicted in FIG. 10 does not have the same DC current 510 flowing through it as does the signal phase generator 132 due to a common-source (CS) amplifier configuration.

Figure 10:
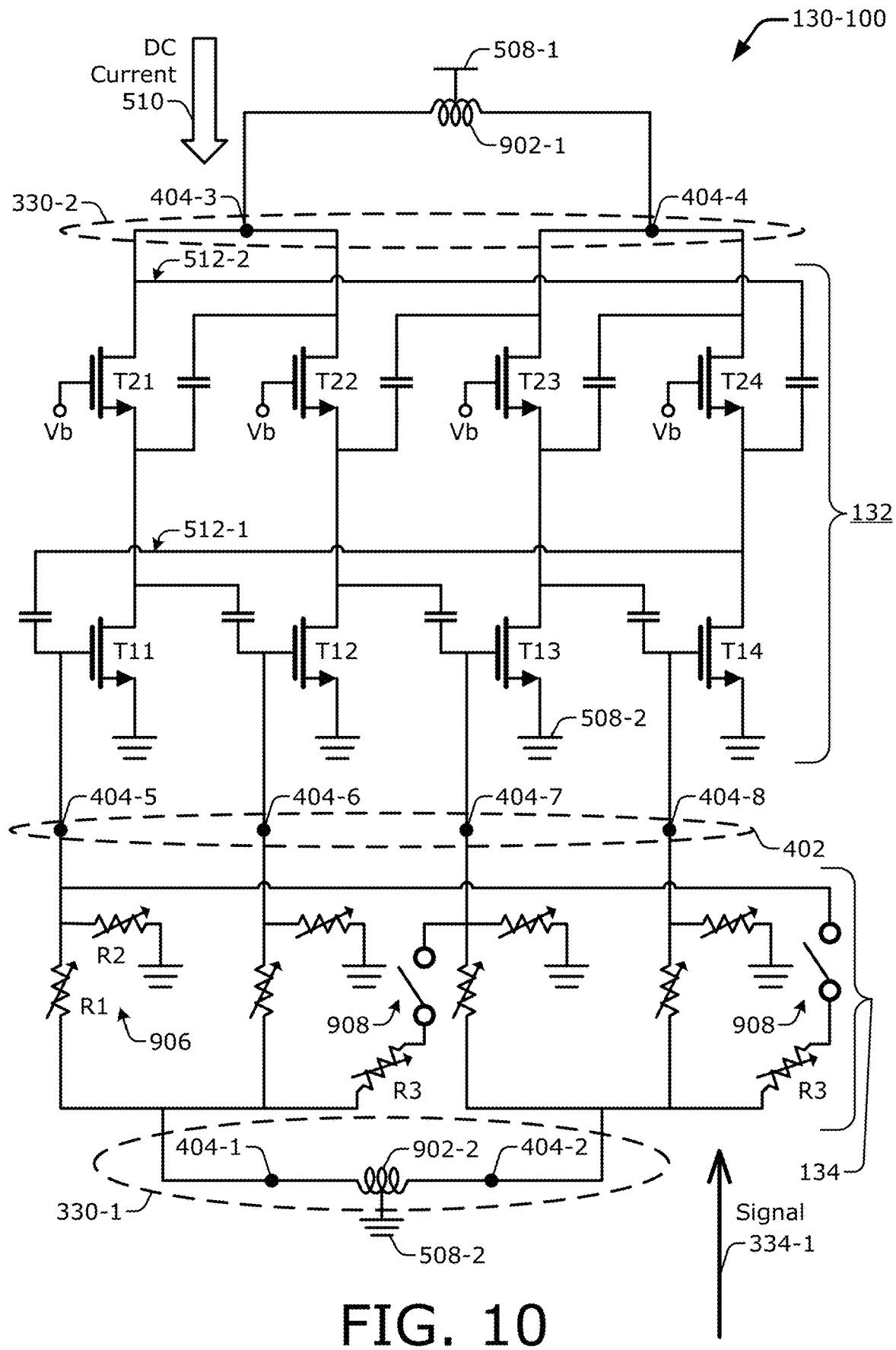
FIG. 10 illustrates another example phase shifter including a signal phase generator and a passive vector modulator that is implemented using resistors.

FIG. 10 illustrates another example phase shifter 130-100 including a signal phase generator 132 and a passive vector modulator 134 that is implemented using resistors. The phase shifter 130-100 is comparable to the phase shifter 130-80 (of FIG. 8) because both employ a CS-CG configuration for the two amplification stages of each amplifier branch or columnar circuit 602. The phase shifter 130-100 is also similar to the phase shifter 130-90 (of FIG. 9) because the vector modulator 134 is implemented using multiple voltage dividers. However, flow of the DC current 510 is different for the phase shifter 130-100 as compared to that of the phase shifter 130-90 due to the CS amplifier configuration of the transistors T11 to T14.

Due to the CS amplifier configuration of the transistors T11 to T14, the DC current 510 flows from the power supply node 508-1, through the transistors T21 to T24, through the transistors T11 to T14, and then to the ground node 508-2. Consequently, the DC current 510 does not flow through the resistors R of the vector modulator 134. This provides for a more stable or predictable performance across process-voltage-temperature (PVT) variations and provides an opportunity for increased gain. However, because the signal is passed from gate terminals to the channels of the transistors T11 to T14, this architecture results in a unidirectional signal flow across the signal phase generator 132 and therefore a unidirectional signal flow across the phase shifter 130 like in FIG. 3-3, which is represented by the singled-headed arrow of the unidirectional signal 334-1. Thus, in this case, the vector modulator 134 operates on the propagating signal 334-1 prior to when the signal phase generator 132 operates on the propagating signal 334-1.

Figure 11:
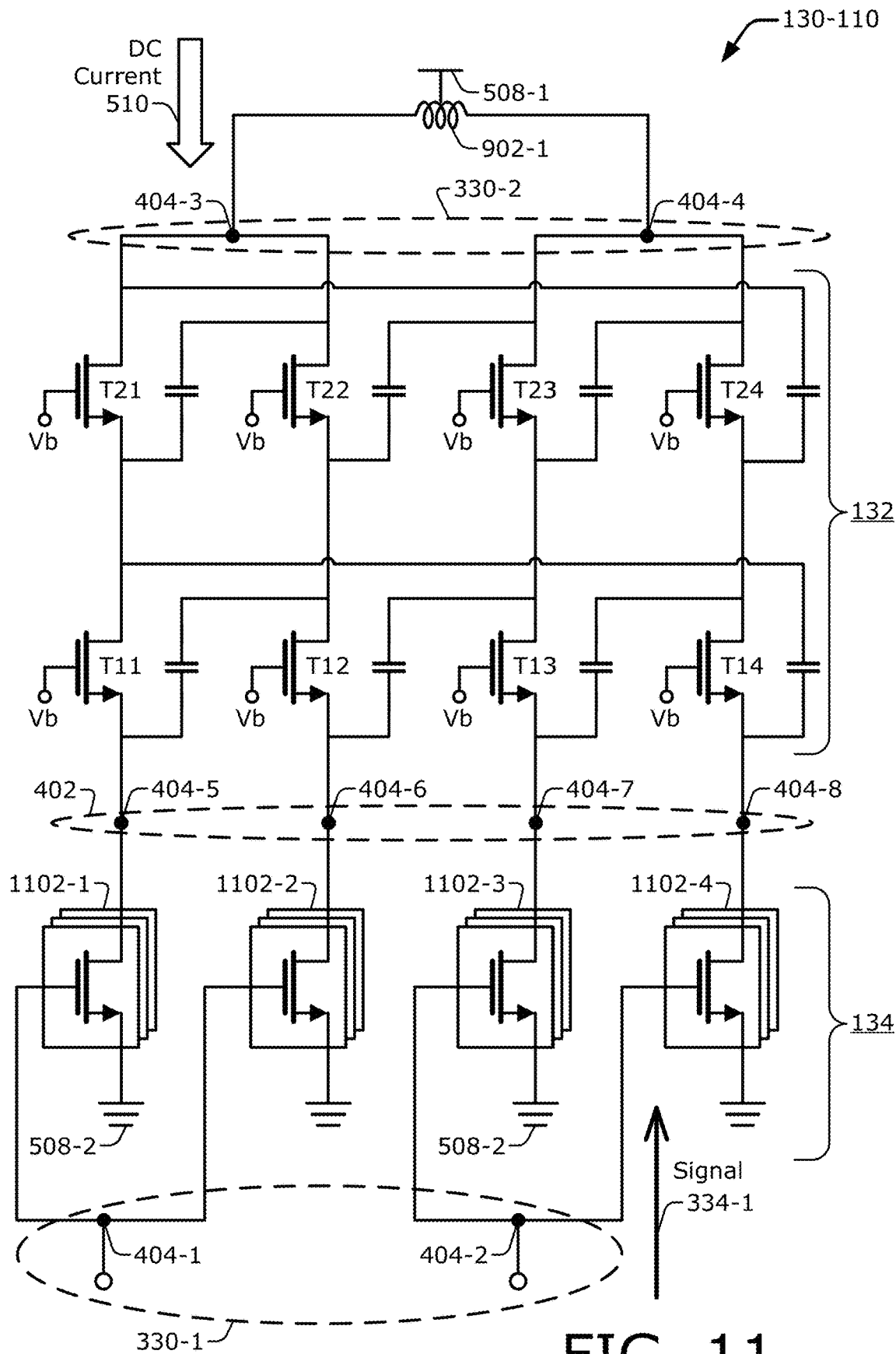
FIG. 11 illustrates an example phase shifter including a signal phase generator and an active vector modulator that is implemented using banks of transistors.

FIG. 11 illustrates an example phase shifter 130-110 including a signal phase generator 132 and an active vector modulator 134 that is implemented using banks of transistors. The phase shifter 130-110 is comparable to the phase shifter 130-70 (of FIG. 7) because both employ a CG-CG configuration for the two amplification stages of each amplifier branch or columnar circuit 602. However, an example implementation for the vector modulator 134 that includes multiple transistors is depicted in FIG. 11.

In example implementations, the multiple transistors are organized into multiple banks of transistors 1102-1, 1102-2, 1102-3, and 1102-4. Each respective bank of transistors 1102 corresponds to a respective portion of multiple portions of the vector modulator 134. Accordingly, each respective bank of transistors 1102 is coupled between a respective amplifier of the multiple amplifiers of the signal phase generator 132 via the interface 402 and at least one node of the first port 330-1 of the phase shifter 130-110. Each bank of transistors 1102 includes a plurality of transistors coupled in parallel with respect to each other between a respective transistor of the multiple transistors T11 to T14 and a node of the first port 330-1. For instance, the plurality of transistors of a first bank of transistors 1102-1 are coupled together in parallel between the fifth node 404-5 of the interface 402 and the ground node 508-2 via the channel terminals thereof. A second bank of transistors 1102-2 is coupled between a sixth node 404-6 and the ground node 508-2 via the channel terminals thereof. Further, a third bank of transistors 1102-3 is coupled between a seventh node 404-7 and the ground node 508-2, and a fourth bank of transistors 1102-4 is coupled between an eighth node 404-8 and the ground node 508-2. The gate terminals of the transistors of the first and second banks of transistors 1102-1 and 1102-2 are coupled to the first node 404-1 of the first port 330-1. The gate terminals of the transistors of the third and fourth banks of transistors 1102-3 and 1102-4 are coupled to the second node 404-2 of the first port 330-1. In FIG. 11, by way of example, the first and second nodes 404-1 and 404-2 of the first port 330-1 can be coupled to another physical component directly, via one or more capacitors, and so forth.

In example operations, at least one component of the unidirectional signal 334-1, which may have a first phase, is applied to gate terminals of the plurality of transistors of both the first and second banks of transistors 1102-1 and 1102-2. At least one other component of the signal 334-1, which may have a second phase, is applied to gate terminals of the plurality of transistors of both the third and fourth banks of transistors 1102-3 and 1102-4. Each bank of transistors 1102 steers current to adjust an amplitude of a respective component of the signal 334-1 that is propagating through the vector modulator 134 via the corresponding respective bank of transistors 1102. A quantity of transistor(s) of a given bank of transistors 1102 can be turned on or off responsive to the phase control signal 208 (e.g., of FIGS. 2, 3-1 to 3-3, and 4-1 to 4-3) to adjust an amount of current that flows through the given bank of transistors 1102. In operation, the vector modulator 134 is therefore steering current to adjust an amplitude of a signal component, and thus at least one phase, of the signal 334-1. Although not shown in FIG. 11, to achieve a phase shift greater than 90 degrees, paths with a switchable connection between one polarity and the other polarity of a differential signal can be included as part of the vector modulator 134 (e.g., in a manner similar to the resistor R3 and the switch 908 of FIGS. 9 and 10). Also, in this case, the vector modulator 134 operates on the propagating signal 334-1 prior to when the signal phase generator 132 operates on the propagating signal 334-1.

The resolution of a phase shift, or a granularity of phase-shift increments, depends in part on a quantity of transistors in each bank of transistors 1102. The phase-shift resolution can also depend at least partly on a size or sizes of the transistors in each bank of transistors 1102. For example, the resolution can be increased by including transistors of different sizes. The different sizes can be determined using any of multiple approaches, such as binary weighting or thermometer coding. Thus, the sizes of the transistors within a given bank of transistors 1102 can vary with respect to each other. To shift a phase of a signal propagating through the phase shifter 130-110, each portion of the vector modulator 134 or bank of transistors 1102 can be separately controlled responsive to the phase control signal 208 to separately adjust a respective amplitude of a corresponding signal component propagating through a respective bank of transistors 1102. Alternatively, the banks of transistors may be controlled in pairs. In these manners, the quantity of transistors or the sizes of transistors turned on or off by the phase control signal 208 in one bank of transistors 1102 can be at least partly independent from the quantity or sizes of transistors turned on or off by the phase control signal 208 in a different bank of transistors.

Figure 12:
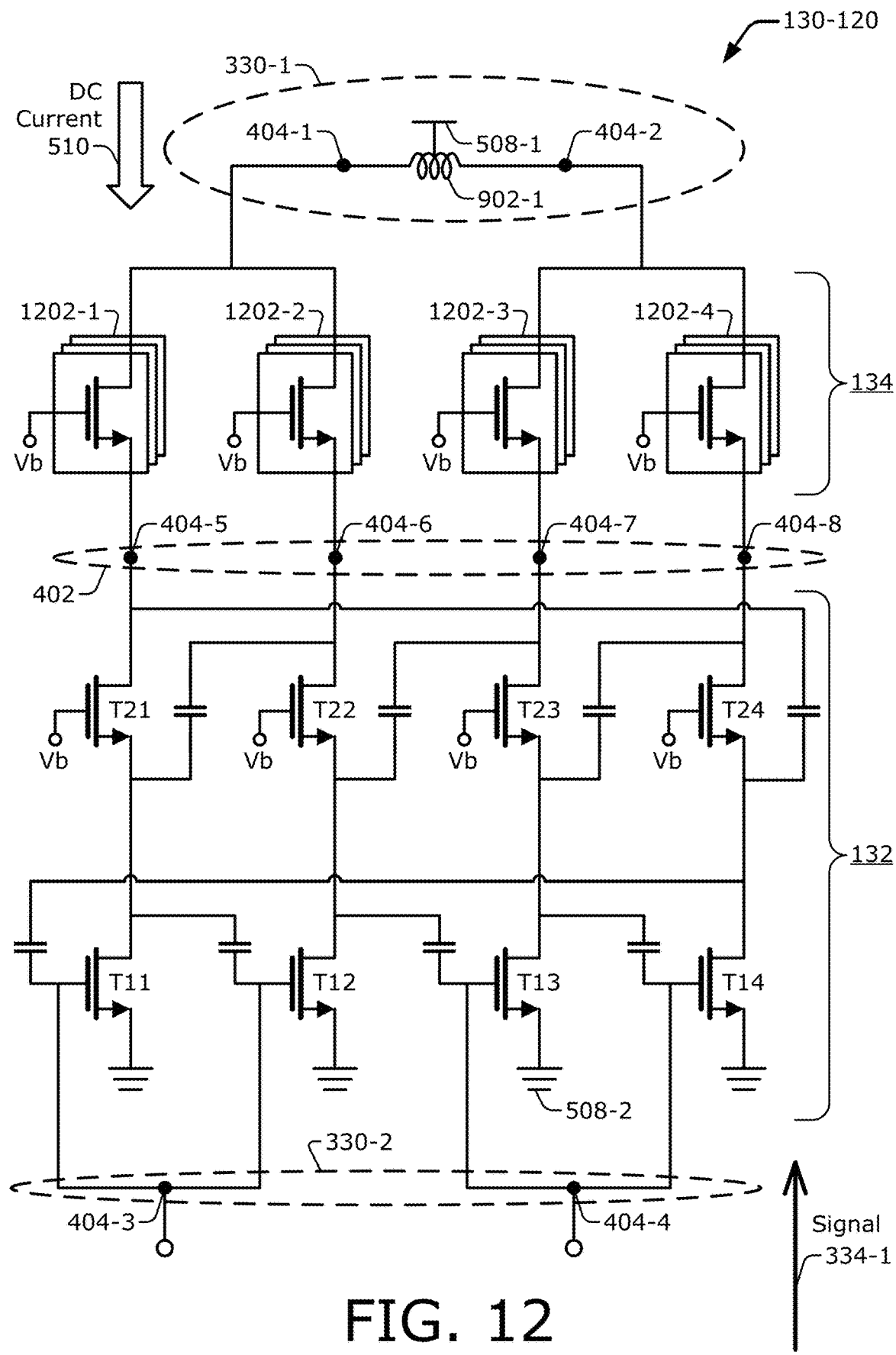
FIG. 12 illustrates another example phase shifter including a signal phase generator and an active vector modulator that is implemented using banks of transistors.

FIG. 12 illustrates another example phase shifter 130-120 including a signal phase generator 132 and an active vector modulator 134 that is implemented using banks of transistors. The phase shifter 130-120 is comparable to the phase shifter 130-80 (of FIG. 8) because both employ a CS-CG configuration for the two amplification stages of each amplifier branch or columnar circuit 602. The phase shifter 130-120 is also similar to the phase shifter 130-110 (of FIG. 11) because the vector modulator 134 is implemented using multiple transistors. However, in addition to the CS amplifier configuration for the first amplification stage, the order of operation is different for the phase shifter 130-120 as compared to that of the phase shifter 130-110. More specifically, in this case the signal phase generator 132 operates on the propagating signal 334-1 prior to when the vector modulator 134 operates on the propagating signal 334-1.

In example implementations, the unidirectional signal 334-1 can be provided to the signal phase generator 132 via the second port 330-2. Here, the third node 404-3 of the second port 330-2 is coupled to the input terminals of the transistors T11 and T12, which input terminals comprise gate terminals for this CS amplifier configuration. The fourth node 404-4 of the second port 330-2 is coupled to the input terminals of the transistors T13 and T14, which input terminals comprise gate terminals for this CS amplifier configuration. The four nodes 404-5 to 404-8 of the interface 402 couple the signal phase generator 132 to the vector modulator 134.

The multiple transistors of the vector modulator 134 are organized into multiple banks of transistors 1202-1, 1202-2, 1202-3, and 1202-4. Each respective bank of transistors 1202 is coupled between a respective amplifier of the multiple amplifiers of the signal phase generator 132 via a respective node of the interface 402 and at least one node of the first port 330-1. Each bank of transistors 1202 includes a plurality of transistors coupled in parallel with respect to each other between a respective transistor of the multiple transistors T21 to T24 and a node of the first port 330-1. For instance, the plurality of transistors of a first bank of transistors 1202-1 are coupled together in parallel between the fifth node 404-5 and the first node 404-1 via the channel terminals thereof. The first and second nodes 404-1 and 404-2 are coupled to the power supply node 508-1 via at least one inductor 902-1. Thus, the propagating signal 334 can be electromagnetically coupled to another physical component via another inductor (not shown) that is inductively coupled to the inductor 902-1 (e.g., as a transformer).

In example operations, the signal phase generator 132 generates at least one additional phase for the signal components of the unidirectional signal 334-1 propagating through the interface 402 as compared to the signal components propagating through the second port 330-2. From the interface 402, respective components of the signal 334-1, which include at least one phase, are provided to source terminals of the plurality of transistors of the first, second, third, and fourth banks of transistors 1202-1, 1202-2, 1202-3, and 1202-4. Each bank of transistors 1202 steers current to adjust an amplitude of a respective component of the signal 334-1 that is propagating across the vector modulator 134 through the corresponding respective bank of transistors 1202. A quantity of transistor(s) of a given bank of transistors 1202 can be turned on or off responsive to the phase control signal 208 (e.g., of FIGS. 2, 3-1 to 3-3, and 4-1 to 4-3) to adjust an amount of current that flows through the given bank of transistors 1202. In this manner, the vector modulator 134 uses current steering to adjust an amplitude of a component of the signal 334-1. After component recombining by the first and second nodes 404-1 and 404-2 at the first port 330-1, the phase of the unidirectional signal 334-1 has been shifted as described above with reference to FIGS. 4-1 and 4-2 to support antenna beamforming.

The resolution of a phase shift, or a granularity of phase-shift increments, depends in part on a quantity of transistors in each bank of transistors 1202. The phase-shift resolution can also depend at least partly on a size or sizes of the transistors in each bank of transistors 1202. For example, the resolution can be increased by including transistors of different sizes. The different sizes can be determined using any of multiple approaches, such as binary weighting or thermometer coding. Thus, the sizes of the transistors within a given bank of transistors 1202 can vary with respect to each other. To shift a phase of a signal propagating through the phase shifter 130-120, each portion of the vector modulator 134 or bank of transistors 1202 can be separately controlled responsive to the phase control signal 208 to separately adjust a respective amplitude of a corresponding signal component propagating through a respective bank of transistors 1202. Alternatively, the banks of transistors may be controlled in pairs. In these manners, the quantity of transistors or the sizes of transistors turned on or off by the phase control signal 208 in one bank of transistors 1202 can be at least partly independent from the quantity or sizes of transistors turned on or off by the phase control signal 208 in a different bank of transistors.

Figures 1, 13:
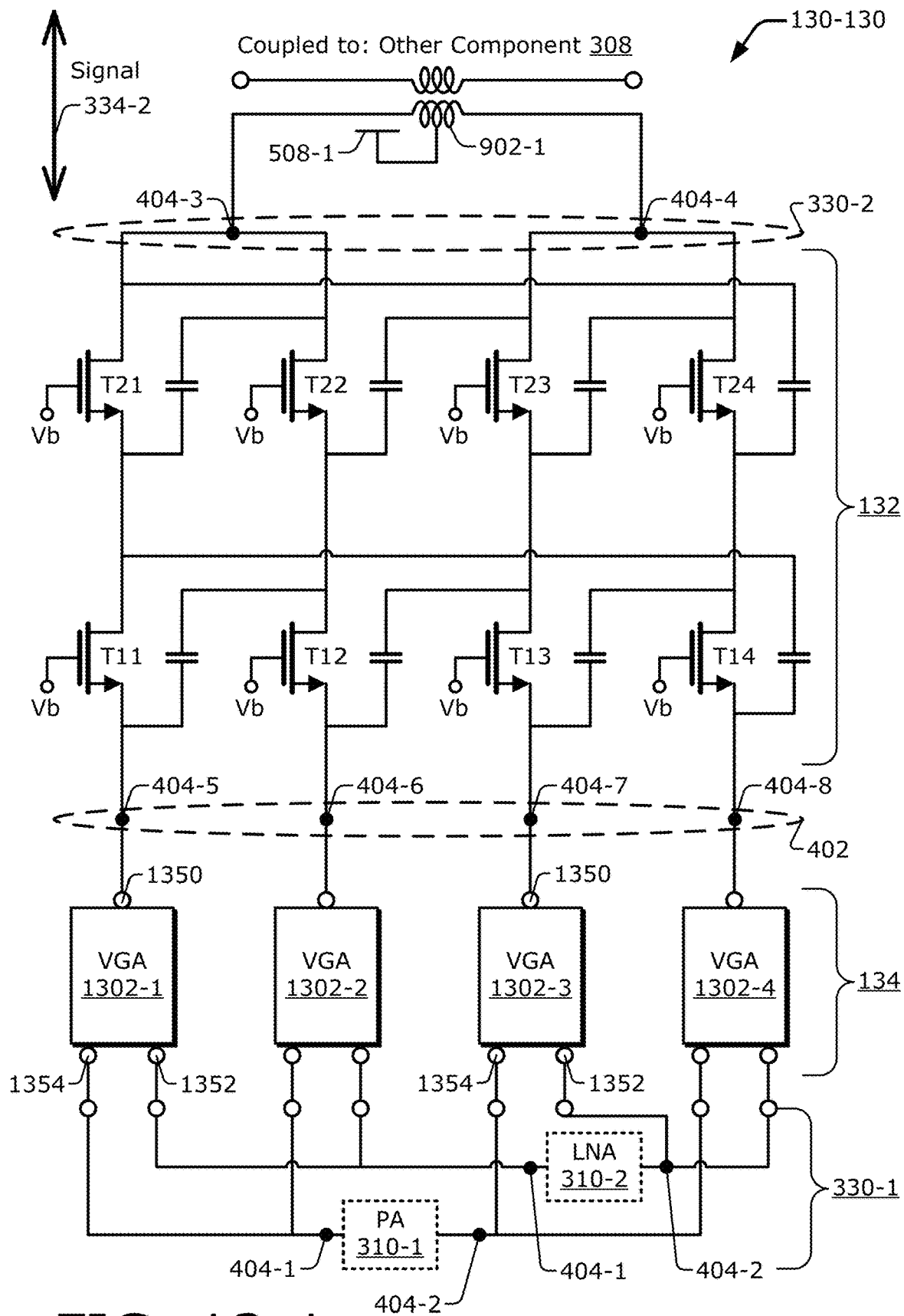
Figures 2, 13:
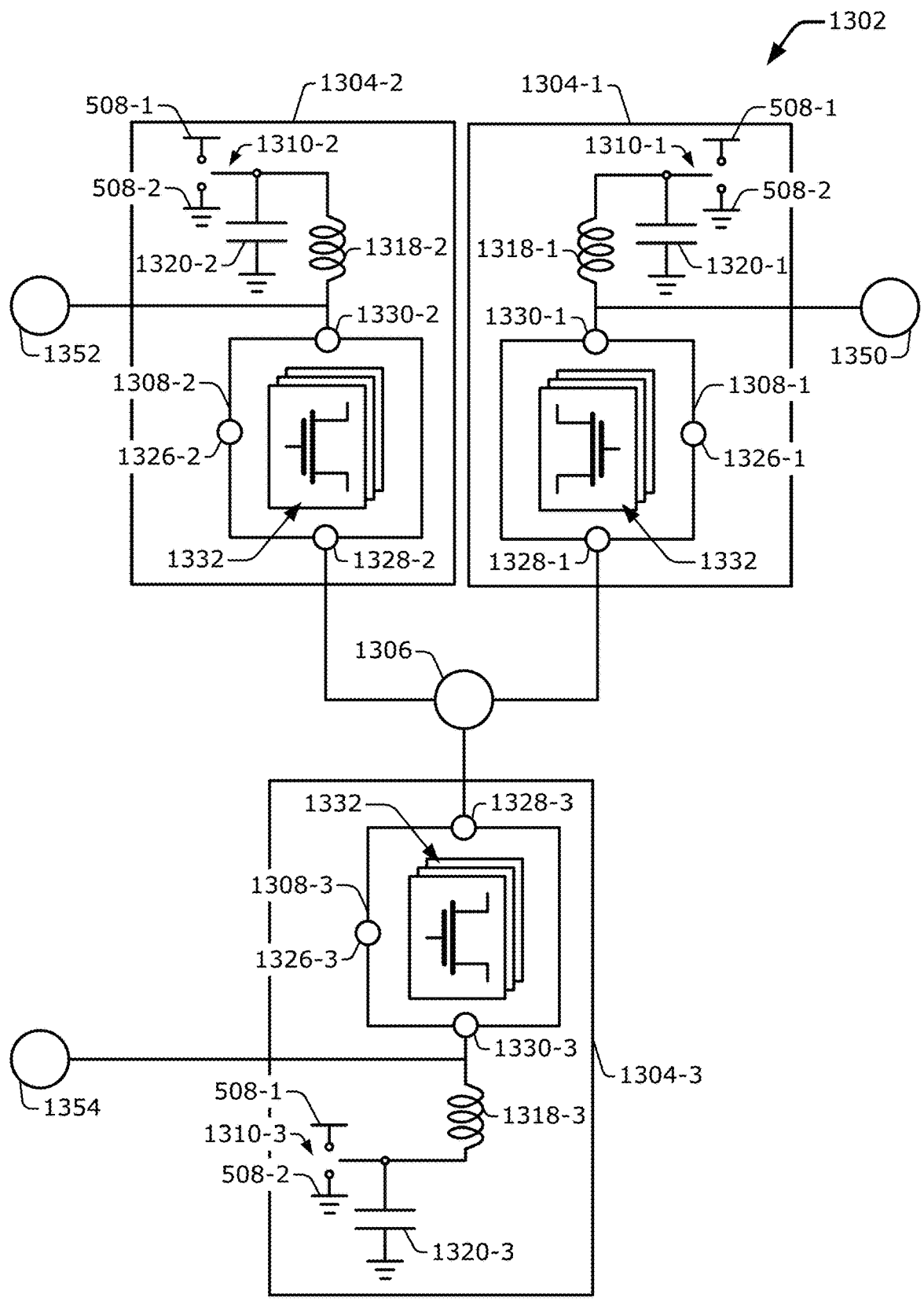

FIG. 13-1 illustrates an example phase shifter 130-130 including a signal phase generator 132 and an active vector modulator 134 that is implemented using banks of transistors configured as multiple variable gain amplifiers (VGAs). The phase shifter 130-130 is comparable to the phase shifter 130-70 (of FIG. 7) because both employ a CG-CG configuration for the two amplification stages of each amplifier branch or columnar circuit 602. However, an example implementation for the vector modulator 134 that includes multiple transistors in each VGA is depicted at FIG. 13-1. These multiple transistors of each VGA of the vector modulator 134 are omitted from FIG. 13-1 but are explicitly depicted in FIG. 13-2. As described further with reference to FIG. 13-2, the phase shifter 130-130 may operate bidirectionally with an active signal phase generator 132 and an active vector modulator 134 as indicated by the bidirectional signal 334-2.

In example implementations, the multiple transistors of the vector modulator 134 are organized into multiple variable gain amplifiers 1302-1, 1302-2, 1302-3, and 1302-4. Each variable gain amplifier (VGA) can be realized as a bidirectional VGA. Each respective variable gain amplifier 1302 (VGA 1302) is coupled between a respective amplifier of the multiple amplifiers of the signal phase generator 132 via the interface 402 and the first port 330-1. The phase shifter 130-130 is coupled between the other component 308 (of FIG. 3, or the signal coupler 306, as indicated at the top of FIG. 13-1) and at least one amplifier 310. The amplifier 310 can include an LNA 310-2 or a PA 310-1 (as indicated at the bottom of FIG. 13-1) of a component chain, which is coupled to an antenna element as shown in FIGS. 3-1 and 3-2. As shown for the VGAs 1302-1 and 1302-3, each VGA 1302 can be coupled between three nodes: a node 1350, a node 1352, and a node 1354.

With the VGA 1302-1, the node 1350 is coupled to the fifth node 404-5 of the interface 402. The node 1352 is coupled to the LNA 310-2 via the first node 404-1 of the first port 330-1, and the node 1354 is coupled to the PA 310-1 via another first node 404-1 of the first port 330-1. The VGA 1302-2 is coupled similarly to the PA 310-1 and the LNA 310-2 but is instead coupled to the sixth node 404-6 of the interface 402. The two VGAs 1302-3 and 1302-4, however, are coupled differently. With the VGA 1302-3, the node 1350 is coupled to the seventh node 404-7 of the interface 402. The node 1352 is coupled to the LNA 310-2 via the second node 404-2 of the first port 330-1, and the node 1354 is coupled to the PA 310-1 via another second node 404-2 of the first port 330-1. The VGA 1302-4 is coupled similarly to the PA 310-1 and the LNA 310-2 but is instead coupled to the eighth node 404-8 of the interface 402. In operation, the vector modulator 134 is applying a variable gain to adjust an amplitude of a signal component, and thus at least one phase, of the signal 334-2. Example implementations of a VGA 1302 are described below with reference to FIG. 13-2.

FIG. 13-2 illustrates an example bidirectional VGA 1302 that can be used in the active vector modulator 134 of FIG. 13-1. The nodes 1350, 1352, and 1354 that are depicted in FIG. 13-2 correspond to those depicted in FIG. 13-1. A VGA 1302 of FIG. 13-2 can be coupled to the remainder of the phase shifter 130-130 of FIG. 13-1 or to another component along a component chain via at least one inductor or a transformer. Alternatively or additionally, the transistors of the VGA 1302 can be realized using a p-type MOS (PMOS) configuration. In the depicted configuration, three branch circuits 1304-1, 1304-2, and 1304-3 respectively include the following: three sets of transistors 1308-1, 1308-2, and 1308-3; three switches 1310-1, 1310-2, and 1310-3; three inductors 1318-1, 1318-2, and 1318-3; and three capacitors 1320-1, 1320-2, and 1320-3. The first branch circuit 1304-1, the second branch circuit 1304-2, and the third branch circuit 1304-3 are coupled between a common node 1306 and respective ones of the nodes 1350, 1352, and 1354.

The switches 1310-1 to 1310-3 each include a pole and two throws. The three poles are respectively coupled to the inductors 1318-1 to 1318-3, and each of the two throws is respectively coupled to a supply voltage node 508-1 or a ground node 508-2. The switches 1310-1 to 1310-3 are each configured to selectively connect the corresponding respective set of transistors 1308-1 to 1308-3 to the supply voltage node 508-1 or the ground node 508-2. As illustrated, the individual switches 1310-1 to 1310-3 are not coupled in series between two of the ports 1350, 1352, or 1354, and the switches 1310-1 to 1320-3 are therefore not within a signal propagation path for a reception operation via the low-noise amplifier 310-2 (of FIGS. 3-1 and 3-2) or a transmission operation via the power amplifier 310-1. In this manner, losses associated with switches disposed in the propagation path can be avoided with this example VGA 1302.

The inductors 1318-1 to 1318-3 are respectively coupled between the respective poles of the switches 1310-1 to 1310-3 and the sets of transistors 1308-1 to 1308-3. The inductors 1318-1 to 1318-3 are configured to resonate at a desired frequency to provide a bandpass response. In particular, the inductors 1318-1 to 1318-3 are configured to pass higher frequencies to the output of the VGA 1302 and to attenuate lower frequencies. Each inductor 1318-1 to 1318-3 also operates as a dummy load if the corresponding set of transistors 1308-1 to 1308-3 operates as the set of current-steering transistors of the VGA 1302 for the vector modulator 134 (e.g., of FIG. 13-1). The capacitors 1320-1 to 1320-3 are coupled between the respective poles of the switches 1310-1 to 1310-3 and the ground node 508-2. In this manner, the capacitors 1320-1 to 1320-3 comprise bypass capacitors that cause the high-frequency signal to "see" a small impedance at the switches 1310-1 to 1310-3. The capacitors 1320-1 to 1320-3 may be omitted in some implementations.

Each of the sets of transistors 1308-1 to 1308-3 include respective gate terminals 1326-1, 1326-2, and 1326-3; respective channel terminals 1328-1, 1328-2, and 1328-3; and respective other channel terminals 1330-1, 1330-2, and 1330-3. Additionally, each of the sets of transistors 1308-1 to 1308-3 include at least one common-gate amplifier 1332. If one or more of the sets of transistors 1308-1 to 1308-3 include multiple common-gate amplifiers 1332, the multiple common-gate amplifiers 1332 are connected together in parallel. In general, the common-gate amplifiers 1332 are symmetrical such that a DC current can flow from the channel terminal 1328 to the other channel terminal 1330, or from the other channel terminal 1330 to the channel terminal 1328, based on a bias voltage provided via the switch 1310. This enables bidirectional operation of the bidirectional VGA 1302.

The gate terminals 1326-1 to 1326-3 are coupled to a voltage generator (not shown), which can be implemented within the wireless interface device 120 and can generate individual gate voltages. If the sets of transistors 1308-1 to 1308-3 each include multiple transistors, each of the gate terminals 1326-1 to 1326-3 can comprise multiple gate terminals coupled to individual transistors within the sets of transistors 1308-1 to 1308-3. In this way, the voltage generator can generate different gate voltages to cause different quantities of transistors within the sets of transistors 1308-1 to 1308-3 to operate in an enabled state (e.g., to operate in either a saturation region or a linear region) or a disabled state (e.g., to operate in a cut-off region). In the enabled state, current flows through the transistor. In the disabled state, current does not substantially flow through the transistor. Based on the gate voltages, the transistors within the set of transistors 1308-1 to 1308-3 can operate as amplifiers or switches. The gate voltages can be associated with analog signals or digital signals that are generated by the voltage generator. Generally, the voltage generator generates a set of gate voltages for each of the three branch circuits 1304-1 to 1304-3 depending on whether a transmission operation or a reception operation is in effect. Depending on operation type, each set of transistors 1308-1 to 1308-3 can function as input transistors, as output transistors, or as current-steering transistors. In an active configuration, the gate voltages are bias voltages that cause the transistors to operate as amplifiers. In a passive configuration, the gate voltages are ground voltages, supply voltages, or a combination thereof that cause the transistors to operate as switches.

Respective channel terminals 1328-1 to 1328-3 and 1330-1 to 1330-3 are connected to terminals of the transistors within the sets of transistors 1308-1 to 1308-3 that have a same doping type. The switches 1310-1 to 1310-3 provide a bias voltage at the channel terminals 1330-1 to 1330-3, which bias voltage causes the channel terminals 1330-1 to 1330-3 to represent source terminals or drain terminals. If, for example, the transistors are n-channel MOSFETs and the switches 1310-1 to 1310-3 connect the channel terminals 1330-1 to 1330-3 to the ground node 508-2, the channel terminals 1330-1 to 1330-3 represent source terminals, and the channel terminals 1328-1 to 1328-3 represent drain terminals. Alternatively, if the switches 1310-1 to 1310-3 connect the channel terminals 1330-1 to 1330-3 to the supply voltage node 508-1, the channel terminals 1330-1 to 1330-3 represent drain terminals, and the channel terminals 1328-1 to 1328-3 represent source terminals.

Figure 14:
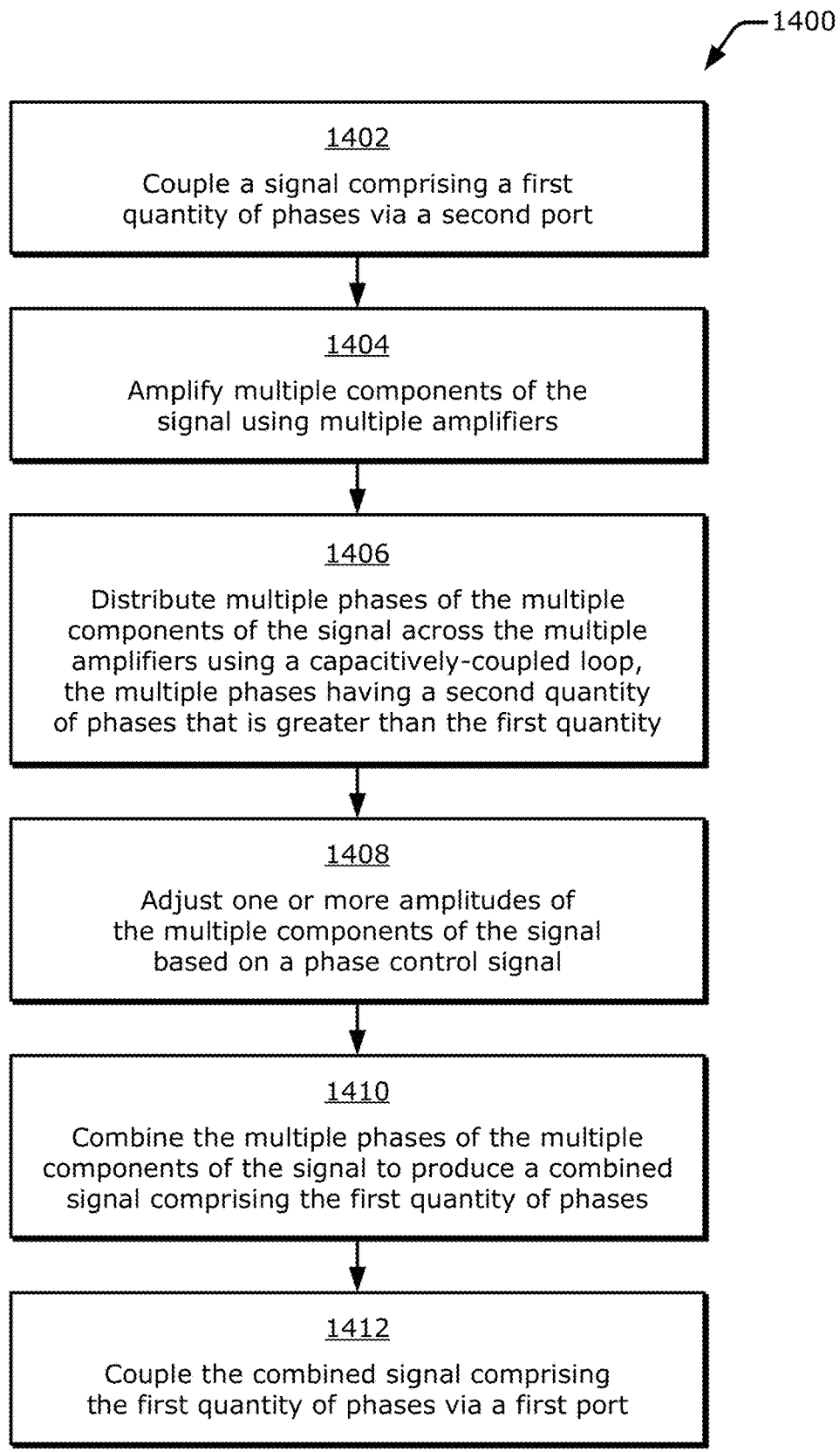
FIG. 14 is a flow diagram illustrating an example process for phase shifting with active signal phase generation.

FIG. 14 is a flow diagram illustrating an example process 1400 for phase shifting with active signal phase generation. The process 1400 is described in the form of a set of blocks 1402-1412 that specify operations that can be performed. However, operations are not necessarily limited to the order shown in FIG. 14 or described herein, for the operations may be implemented in alternative orders or in fully or partially overlapping manners. Also, more, fewer, and/or different operations may be implemented to perform the process 1400, or an alternative process. Operations represented by the illustrated blocks of the process 1400 may be performed by a transceiver 126 or an RF front-end 128, or a portion thereof, in conjunction with a communication processor 124 (e.g., of FIGS. 1 and 2). More specifically, the operations of the process 1400 may be performed by a phase shifter 130.

At block 1402, a signal comprising a first quantity of phases is coupled via a second port. For example, a phase shifter 130 can couple a signal 334 having a first quantity of phases via a second port 330-2. In some cases, the signal 334 may have two phases, such as zero and 180 degrees (0° and 180°).

At block 1404, multiple components of the signal are amplified using multiple amplifiers. For example, the phase shifter 130 can amplify multiple components (e.g., two or more signal components of the components 406-1 to 406-8) of the signal 334 using multiple amplifiers 502-1 ... 502-n. Each amplifier 502 may include at least one amplification stage 504, each of which may operate using at least one transistor.

At block 1406, multiple phases of the multiple components of the signal are distributed across the multiple amplifiers using a capacitively-coupled loop, with the multiple phases having a second quantity of phases that is greater than the first quantity. For example, the phase shifter 130 can distribute multiple phases of the multiple components of the signal 334 across the multiple amplifiers 502-1 ... 502-n using a capacitively-coupled loop 512, with the multiple phases having a second quantity of phases that is greater than the first quantity. This phase distribution may be performed by a signal phase generator 132. The capacitively-coupled loop 512 may include multiple capacitors 506-1 ... 506-n that are respectively coupled between adjacent pairs of amplifiers, such as a second amplifier 502-2 and a third amplifier 502-3. Here, if the first quantity is two, the second quantity may be four.

At block 1408, one or more amplitudes of the multiple components of the signal are adjusted based on a phase control signal. For example, the phase shifter 130 can adjust one or more amplitudes of the multiple components of the signal 334 based on a phase control signal 208. To do so, an active or a passive vector modulator 134 may amplify multiple signal components (e.g., the first component 406-1 and the second component 406-2 or the fifth through eighth components 406-5 to 406-8) before or after the quantity of signal components is changed by the signal phase generator 132 along a given signal flow direction 202.

At block 1410, the multiple phases of the multiple components of the signal are combined to produce a combined signal comprising the first quantity of phases. For example, the phase shifter 130 can combine the multiple phases of the multiple components of the signal 334 to produce a combined signal having the first quantity of phases. To do so, in-phase and quadrature pairs of signal components may be routed to at least one node, such as a current-summing node.

At block 1412, the combined signal comprising the first quantity of phases is coupled via a first port. For example, the phase shifter 130 can couple the combined signal having the first quantity of phases via a first port 330-1 The phase shifter 130 may thus provide a phase-shifted signal to another component along a component chain 304.

The terms "first," "second," "third," and other numeric-related indicators are used herein to identify or distinguish similar or analogous items from one another within a given context—such as a particular implementation, a given circuit, a single drawing figure, or a claim. Thus, a first item in one context may differ from a first item in another context. For example, an item identified as a "first amplifier" in one context may be identified as a "second amplifier" in another context. Similarly, a "first port" in one implementation may be identified as a "second port" in another implementation, or a "first signal component" having a given relative phase at one location of a phase shifter may be identified as a "third signal component" having the given relative phase at another location of the phase shifter. Further, numerically-identified amplifiers may be arranged differently relative to other numerically-identified amplifiers in various contexts (e.g., may be coupled together in different orders).

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described above in language specific to structural features or methodological operations, it is to be understood that the subject matter defined in the appended claims below is not necessarily limited to the specific features or operations described above, including not necessarily being limited to the organizations in which features are arranged or the orders in which operations are performed. Instead, the scope of the invention is provided by the claims as set forth below.

What is claimed is:

1. An apparatus for phase-shifting signals, the apparatus comprising:
    a phase shifter comprising:
        a first port;
        a second port;
        a vector modulator coupled to the first port; and
        a signal phase generator comprising:
            multiple amplifiers coupled between the vector modulator and the second port; and
            multiple capacitors that couple the multiple amplifiers together to form a loop, each respective capacitor of the multiple capacitors coupled between a respective pair of consecutive amplifiers of the multiple amplifiers to form the loop, the respective pair of consecutive amplifiers comprising a first amplifier having an input terminal and a second amplifier having an output terminal, a capacitor of the multiple capacitors coupled between the input terminal of the first amplifier and the output terminal of the second amplifier.

2. The apparatus of claim 1, wherein the phase shifter is configured to cause a direct-current (DC) current to flow through the multiple amplifiers of the signal phase generator during phase-shifting operations.

3. The apparatus of claim 1, further comprising:
    a first power distribution node; and
    a second power distribution node, wherein:
    the signal phase generator is coupled between the first power distribution node and the second power distribution node; and
    the signal phase generator is configured to cause a direct-current (DC) current to flow through the multiple amplifiers between the first power distribution node and the second power distribution node.

4. The apparatus of claim 3, wherein the signal phase generator is coupled to the first power distribution node via an inductor.

5. The apparatus of claim 1, wherein:
    the first port comprises one or more nodes;
    the second port comprises another one or more nodes; and
    the signal phase generator is coupled to the vector modulator via an interface that comprises two or more nodes.

6. The apparatus of claim 5, wherein:
    the one or more nodes of the first port correspond to a first quantity;
    the other one or more nodes of the second port correspond to the first quantity;
    the two or more nodes of the interface correspond to a second quantity; and
    the first quantity is less than the second quantity.

7. The apparatus of claim 6, wherein:
    each respective node of the two or more nodes of the interface comprise at least a point of a respective electrical conductor of two or more electrical conductors extending between the signal phase generator and the vector modulator;
    the first quantity comprises two; and
    the second quantity comprises four.

8. The apparatus of claim 6, wherein the signal phase generator is configured to increase a quantity of phases associated with a signal that propagates between the second port and the interface.

9. The apparatus of claim 1, wherein each respective capacitor of the multiple capacitors is coupled between a respective pair of consecutive amplifiers of the multiple amplifiers via terminal types that differ between the consecutive amplifiers of each respective pair of consecutive amplifiers.

10. The apparatus of claim 9, wherein each terminal type of the terminal types is selected from a group comprising: a gate terminal, a source terminal, or a drain terminal of a transistor.

11. The apparatus of claim 1, wherein:
    an amplifier of the multiple amplifiers comprises a transistor;
    the transistor is associated with a transconductive (Gm) value representative of a transconductance of the transistor;
    a capacitor of the multiple capacitors is associated with a capacitive value representative of a capacitance of the capacitor; and
    at least one of the transconductive (Gm) value or the capacitive value is based on a target frequency of operation of the phase shifter.

12. The apparatus of claim 11, wherein a product of the transconductive (Gm) value and the capacitive value is proportional to the target frequency of operation of the phase shifter.

13. The apparatus of claim 1, wherein:
    the input terminal corresponds to a node that is configured to accept a propagating signal from a component for at least one operational mode of the phase shifter; and
    the output terminal corresponds to another node that is configured to provide the propagating signal to another component for the at least one operational mode of the phase shifter.

14. The apparatus of claim 1, wherein:
    the first amplifier comprises a first transistor, and the input terminal of the first amplifier comprises a source terminal of the first transistor; and
    the second amplifier comprises a second transistor, and the output terminal of the second amplifier comprises a drain terminal of the second transistor.

15. The apparatus of claim 1, wherein:
    the first amplifier comprises a first transistor, and the input terminal of the first amplifier comprises a drain terminal of the first transistor; and
    the second amplifier comprises a second transistor, and the output terminal of the second amplifier comprises a source terminal of the second transistor.

16. The apparatus of claim 1, wherein:
    the first amplifier comprises a first transistor, and the input terminal of the first amplifier comprises a gate terminal of the first transistor; and
    the second amplifier comprises a second transistor, and the output terminal of the second amplifier comprises a drain terminal of the second transistor.

17. The apparatus of claim 1, wherein:
the multiple amplifiers comprise four amplifiers; and
the multiple capacitors comprise four capacitors.

18. The apparatus of claim 17, wherein the four amplifiers correspond to at least one of:
a differential in-phase (I) signal component and a differential quadrature (Q) signal component; or
four signal components having relative phases of zero (0) degrees, 90 degrees, 180 degrees, and 270 degrees.

19. The apparatus of claim 1, wherein:
the loop comprises a first loop and a second loop;
each amplifier of the multiple amplifiers comprises:
a first amplification stage; and
a second amplification stage coupled to the first amplification stage; and
the multiple capacitors comprise:
a first set of capacitors that couple the first amplification stages of the multiple amplifiers together to form the first loop; and
a second set of capacitors that couple the second amplification stages of the multiple amplifiers together to form the second loop.

20. The apparatus of claim 19, wherein, for each amplifier of the multiple amplifiers:
the first amplification stage is configured as a common-gate amplifier; and
the second amplification stage is configured as a common-gate amplifier.

21. The apparatus of claim 19, wherein, for each amplifier of the multiple amplifiers:
the first amplification stage is configured as a common-source amplifier; and
the second amplification stage is configured as a common-gate amplifier.

22. The apparatus of claim 1, wherein the vector modulator is configured to adjust an amplitude of at least one component of a signal propagating through the vector modulator.

23. The apparatus of claim 1, wherein, for at least one operational mode of the phase shifter:
the vector modulator is configured to accept, via the first port, a signal propagating along a signal flow direction;
the vector modulator is configured to provide to the signal phase generator the signal propagating along the signal flow direction;
the signal phase generator is configured to accept from the vector modulator the signal propagating along the signal flow direction; and
the signal phase generator is configured to provide, via the second port, the signal propagating along the signal flow direction.

24. The apparatus of claim 1, wherein, for at least one operational mode of the phase shifter:
the signal phase generator is configured to accept, via the second port, a signal propagating along a signal flow direction;
the signal phase generator is configured to provide to the vector modulator the signal propagating along the signal flow direction;
the vector modulator is configured to accept from the signal phase generator the signal propagating along the signal flow direction; and
the vector modulator is configured to provide, via the first port, the signal propagating along the signal flow direction.

25. The apparatus of claim 1, wherein the vector modulator comprises:
multiple adjustable resistors comprising pairs of adjustable resistors, each respective pair of adjustable resistors configured as a respective voltage divider and coupled to a respective amplifier of the multiple amplifiers.

26. The apparatus of claim 25, wherein:
an adjustable resistor of a pair of adjustable resistors of the pairs of adjustable resistors is coupled between a first plus node and a second plus node of the phase shifter; and
at least one adjustable resistor of the multiple adjustable resistors is coupled between the first plus node and a minus node of the phase shifter.

27. The apparatus of claim 25, wherein each adjustable resistor of at least a portion of the multiple adjustable resistors comprises:
at least one resistive element; or
at least one transistor.

28. The apparatus of claim 1, wherein the vector modulator comprises:
multiple transistors comprising multiple banks of transistors, respective banks of transistors coupled between respective amplifiers of the multiple amplifiers of the signal phase generator and the first port.

29. The apparatus of claim 28, wherein:
each respective bank of transistors of the multiple banks of transistors comprises a plurality of transistors coupled together in parallel between a respective amplifier of the multiple amplifiers and the first port; and
each bank of transistors of the multiple banks of transistors is configured to steer current to adjust one or more amplitudes of at least one component of a signal propagating through the vector modulator.

30. The apparatus of claim 28, wherein:
each respective bank of transistors of the multiple banks of transistors comprises:
a first branch circuit comprising a first plurality of transistors;
a second branch circuit comprising a second plurality of transistors; and
a third branch circuit comprising a third plurality of transistors, the third branch circuit coupled to the first branch circuit and the second branch circuit at a respective common node; and
the first branch circuit of each respective bank of transistors is coupled to a respective amplifier of the multiple amplifiers.

31. The apparatus of claim 30, wherein:
the second branch circuit of each respective bank of transistors is coupled between the respective common node and a low-noise amplifier; and
the third branch circuit of each respective bank of transistors is coupled between the respective common node and a power amplifier.

32. The apparatus of claim 30, wherein:
the first branch circuit of each respective bank of transistors is coupled between the respective common node and a first switch of the respective bank of transistors, the first switch switchably coupled to a supply voltage node or a ground node; and
the second branch circuit of each respective bank of transistors is coupled between the respective common node and a second switch of the respective bank of transistors, the second switch switchably coupled to the supply voltage node or the ground node.

33. The apparatus of claim 30, wherein each respective bank of transistors of the multiple banks of transistors comprises a respective bidirectional variable gain amplifier of multiple bidirectional variable gain amplifiers.

34. The apparatus of claim 1, wherein the signal phase generator comprises multiple columnar circuits extending between the second port and the vector modulator, each respective columnar circuit of the multiple columnar circuits comprising a respective amplifier of the multiple amplifiers.

35. The apparatus of claim 34, wherein:
the vector modulator comprises multiple portions, each respective portion of the multiple portions coupled to a respective columnar circuit of the multiple columnar circuits of the signal phase generator; and
each respective portion of the multiple portions of the vector modulator is configured to adjust, for the respective amplifier corresponding thereto, an amplitude of a respective component of a signal propagating through the phase shifter.

36. The apparatus of claim 1, further comprising:
an antenna array comprising multiple antenna elements, at least one antenna element of the multiple antenna elements coupled to the phase shifter; and
a wireless interface device coupled to the antenna array, the wireless interface device comprising the phase shifter and configured to steer, using the phase shifter, wireless signals communicated via the antenna array.

37. The apparatus of claim 36, further comprising:
a display screen; and
a processor operatively coupled to the display screen and at least a portion of the wireless interface device, the processor configured to present one or more graphical images on the display screen based on the wireless signals communicated by the wireless interface device using the phase shifter.

38. An apparatus for phase-shifting signals, the apparatus comprising:
a phase shifter comprising:
a first port;
a second port;
a vector modulator coupled to the first port; and
a signal phase generator comprising:
amplification means for amplifying a signal being phase shifted, the amplification means comprising multiple input terminals and multiple output terminals and coupled between the vector modulator and the second port; and
capacitive means for distributing multiple phases of the signal across the amplification means in a loop, the capacitive means coupling the multiple input terminals to the multiple output terminals between pairs of consecutive amplifiers of the amplification means.

39. The apparatus of claim 38, wherein:
the amplification means comprises multiple amplification stages; and
at least one amplification stage of the multiple amplification stages comprises means for inputting the signal to multiple transistors via channel terminals of the multiple transistors, the channel terminals of the multiple transistors comprising the multiple input terminals.

40. The apparatus of claim 38, wherein:
the amplification means comprises multiple amplification stages; and
at least one amplification stage of the multiple amplification stages comprises means for inputting the signal to multiple transistors via gate terminals of the multiple transistors, the gate terminals of the multiple transistors comprising the multiple input terminals.

41. The apparatus of claim 38, wherein the vector modulator is configured to adjust at least one amplitude of one or more components of the signal.

42. The apparatus of claim 41, wherein the vector modulator comprises passive means for adjusting the at least one amplitude of the one or more components of the signal.

43. The apparatus of claim 41, wherein the vector modulator comprises active means for adjusting the at least one amplitude of the one or more components of the signal.

44. The apparatus of claim 43, wherein the active means for adjusting the at least one amplitude comprises at least one plurality of transistors coupled together in parallel between the first port and the signal phase generator.

45. The apparatus of claim 43, wherein the active means for adjusting the at least one amplitude comprises multiple variable gain amplifiers (VGAs) coupled between the first port and the signal phase generator.

46. The apparatus of claim 41, further comprising:
control means for providing a phase control signal,
wherein the vector modulator is configured to adjust the at least one amplitude of the one or more components of the signal responsive to the phase control signal.

47. A method for phase shifting with active signal phase generation, the method comprising:
coupling a signal comprising a first quantity of phases via a second port;
amplifying multiple components of the signal using multiple amplifiers;
distributing multiple phases of the multiple components of the signal across the multiple amplifiers using a capacitively-coupled loop in which capacitors respectively couple an input terminal of a first amplifier to an output terminal of a second amplifier that is consecutively arranged with the first amplifier in the capacitively-coupled loop, the multiple phases having a second quantity of phases that is greater than the first quantity;
adjusting one or more amplitudes of the multiple components of the signal based on a phase control signal;
combining the multiple phases of the multiple components of the signal to produce a combined signal comprising the first quantity of phases; and
coupling the combined signal comprising the first quantity of phases via a first port.

48. The method of claim 47, wherein the phase control signal is representative of a phase shift amount for a phase shifter that comprises the first port and the second port.

49. The method of claim 48, further comprising:
generating signal phase components of the signal for the phase shifter, the generating comprising:
the amplifying of the multiple components of the signal; and
the distributing of the multiple phases of the multiple components of the signal across the multiple amplifiers using the capacitively-coupled loop; and
vector modulating the signal phase components of the signal for the phase shifter, the vector modulating comprising the adjusting of the one or more amplitudes of the multiple components of the signal.

50. The method of claim 47, wherein:
the capacitively-coupled loop comprises a first capacitively-coupled loop and a second capacitively-coupled loop;
the amplifying comprises amplifying the multiple components of the signal using first amplification stages and second amplification stages of the multiple amplifiers; and
the distributing comprises:
distributing the multiple phases of the multiple components of the signal across the first amplification stages of the multiple amplifiers using the first capacitively-coupled loop; and
distributing the multiple phases of the multiple components of the signal across the second amplification stages of the multiple amplifiers using the second capacitively-coupled loop.

51. The method of claim 47, wherein:
each amplifier of the multiple amplifiers respectively comprises a transistor of multiple transistors; and
the amplifying comprises inputting the multiple components of the signal into multiple source terminals of the multiple transistors.

52. The method of claim 47, wherein:
each amplifier of the multiple amplifiers respectively comprises a transistor of multiple transistors; and
the amplifying comprises inputting the multiple components of the signal into multiple gate terminals of the multiple transistors.

53. The method of claim 47, wherein:
the distributing of the multiple phases of the multiple components of the signal is performed by a signal phase generator coupled between the second port and a vector modulator;
the adjusting of the one or more amplitudes of the multiple components of the signal is performed by the vector modulator, which is coupled between the signal phase generator and the first port; and
the adjusting of the one or more amplitudes of the multiple components of the signal is performed prior to the distributing of the multiple phases of the multiple components of the signal.

54. The method of claim 47, wherein the adjusting comprises at least one of:
dividing at least one voltage for each component of the multiple components of the signal to adjust the one or more amplitudes based on the phase control signal;
steering current with regard to each component of the multiple components of the signal to adjust the one or more amplitudes based on the phase control signal; or
applying a variable gain to amplify each component of the multiple components of the signal to adjust the one or more amplitudes based on the phase control signal.

55. The method of claim 47, further comprising at least one of:
low-noise amplifying at least one of the signal or the combined signal; or
power amplifying at least one of the signal or the combined signal.

56. The method of claim 55, wherein:
the coupling via the second port comprises accepting the signal, which comprises an input phase, for a beamsteering operation; and
the coupling via the first port comprises providing the combined signal, which comprises a delayed phase relative to the input phase, for the beamsteering operation.

57. The method of claim 55, wherein:
the coupling via the first port comprises accepting the combined signal, which comprises an input phase, for a beamsteering operation; and
the coupling via the second port comprises providing the signal, which comprises a delayed phase relative to the input phase, for the beamsteering operation.

58. An apparatus for phase-shifting signals, the apparatus comprising:
a phase shifter comprising;
a first port comprising two or more nodes;
a second port comprising two or more nodes;
an interface comprising four or more nodes;
a vector modulator coupled between the first port and the interface; and
a signal phase generator comprising:
four or more columnar circuits coupled between the interface and the second port, each columnar circuit comprising a first transistor and a second transistor, the first transistor and the second transistor of each respective columnar circuit coupled together in series between a node of the interface and a node of the second port;
a first set of four or more capacitors that couple the four or more columnar circuits together to form a first loop, each respective capacitor coupled between a respective pair of first transistors from two consecutive columnar circuits of the four or more columnar circuits to form the first loop; and
a second set of four or more capacitors that couple the four or more columnar circuits together to form a second loop, each respective capacitor coupled between a respective pair of second transistors from two consecutive columnar circuits of the four or more columnar circuits to form the second loop.

59. The apparatus of claim 58, wherein the vector modulator comprises:
four or more portions, each portion coupled between a node of the two or more nodes of the first port and a respective node of the four or more nodes of the interface.

60. The apparatus of claim 59, wherein each portion of the four or more portions of the vector modulator is configured to adjust a respective amplitude of a respective component of four or more components of a signal propagating through the phase shifter.

61. The apparatus of claim 60, wherein:
the phase shifter is configured to propagate the signal through the first port with two phases;
the phase shifter is configured to propagate the signal through the first transistor and the second transistor with four phases; and
the phase shifter is configured to propagate the signal over the second port with the two phases.

62. The apparatus of claim 58, wherein:
the first loop comprises a first circuit loop; and
each respective capacitor of the first circuit loop is coupled between an input terminal and an output terminal of the respective pair of first transistors from two consecutive columnar circuits of the four or more columnar circuits to form the first circuit loop.

* * * * *